United States Patent
Sasago et al.

(10) Patent No.: US 8,901,712 B2
(45) Date of Patent: Dec. 2, 2014

(54) SEMICONDUCTOR MEMORY DEVICE

(71) Applicant: Hitachi, Ltd., Tokyo (JP)

(72) Inventors: Yoshitaka Sasago, Tachikawa (JP); Akira Kotabe, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/798,534

(22) Filed: Mar. 13, 2013

(65) Prior Publication Data

US 2013/0292630 A1 Nov. 7, 2013

(30) Foreign Application Priority Data

May 1, 2012 (JP) .................................. 2012-104701

(51) Int. Cl.
  *H01L 27/24* (2006.01)
  *G11C 13/00* (2006.01)
  *H01L 45/00* (2006.01)

(52) U.S. Cl.
  CPC ......... *H01L 27/2463* (2013.01); *H01L 45/1226* (2013.01); *H01L 45/144* (2013.01); *H01L 27/2454* (2013.01); *H01L 27/249* (2013.01); *H01L 45/06* (2013.01); *G11C 13/0007* (2013.01); *G11C 2213/71* (2013.01); *G11C 13/0004* (2013.01)
  USPC ............... 257/536; 257/5; 257/380; 365/148; 365/163

(58) Field of Classification Search
  USPC ........... 257/1–5, 379–381; 365/148, 158, 163
  See application file for complete search history.

(56) References Cited

U.S. PATENT DOCUMENTS

| | | | |
|---|---|---|---|
| 2006/0273298 A1* | 12/2006 | Petti | 257/5 |
| 2008/0149913 A1* | 6/2008 | Tanaka et al. | 257/5 |
| 2010/0182828 A1* | 7/2010 | Shima et al. | 365/163 |
| 2011/0122676 A1 | 5/2011 | Murooka et al. | |
| 2012/0248399 A1 | 10/2012 | Sasago et al. | |

FOREIGN PATENT DOCUMENTS

| | | |
|---|---|---|
| JP | 2008-160004 A | 7/2008 |
| JP | 2010-165982 A | 7/2010 |
| JP | 2011-114016 A | 6/2011 |
| WO | WO 2011/074545 A1 | 6/2011 |

* cited by examiner

*Primary Examiner* — Daniel Shook
(74) *Attorney, Agent, or Firm* — Miles & Stockbridge P.C.

(57) ABSTRACT

The technical problem to be solved is to achieve high density with simple manufacturing process to decrease bit costs of memory.

A semiconductor memory device according to a first aspect of the present invention includes a variable resistance material layer and a channel layer that are connected in series between a first diffusion layer and a metal wire, thereby separating the metal wire and a channel semiconductor layer.

A semiconductor memory device according to a second aspect of the present invention includes a variable resistance material layer electrically connecting channel semiconductor layers opposed to each other in a first direction and electrically connecting channel semiconductor layers adjacent to each other in a second direction, wherein a plurality of the channel semiconductor layers is disposed in the second direction.

17 Claims, 23 Drawing Sheets

FIG. 1
(a)
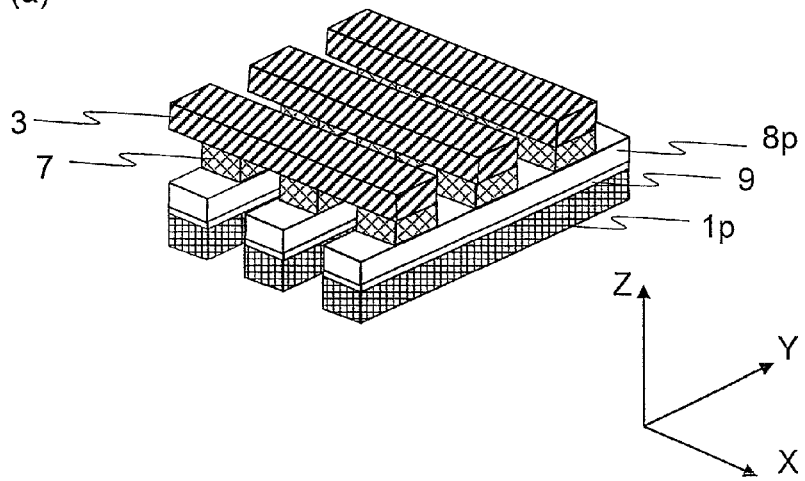
(b)
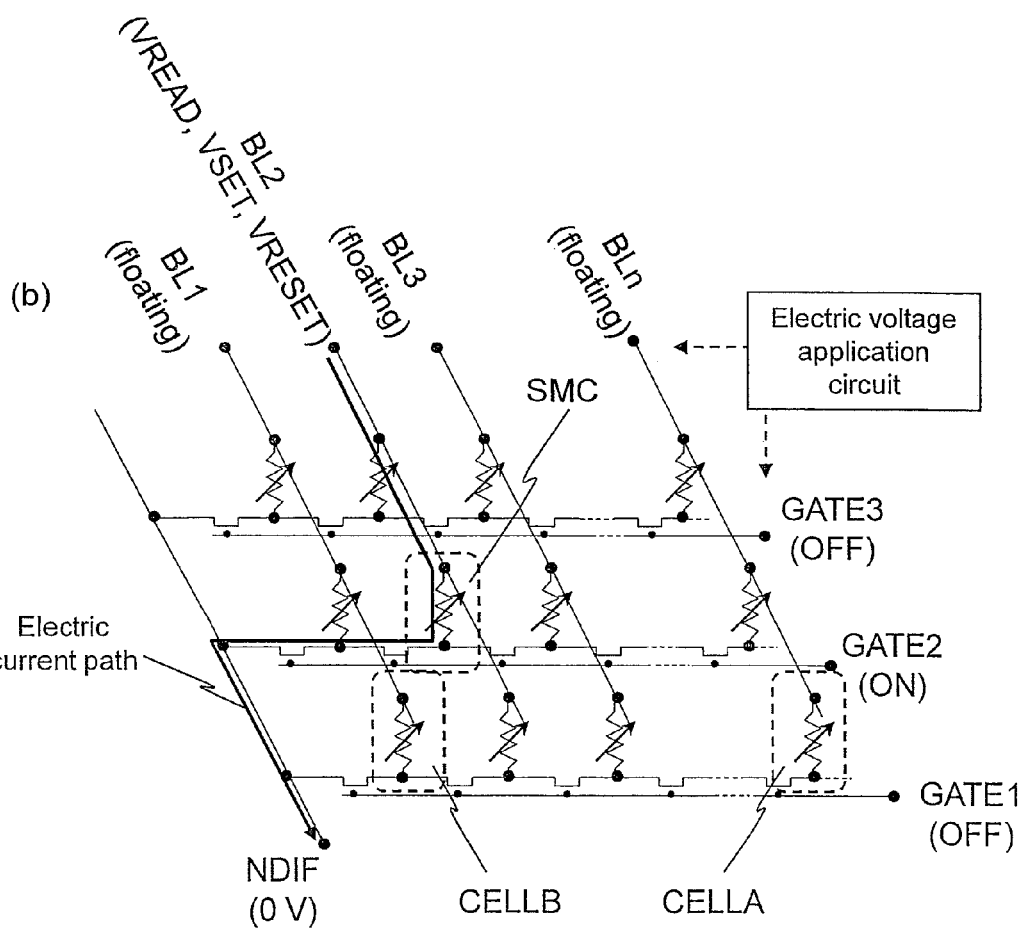

FIG. 4
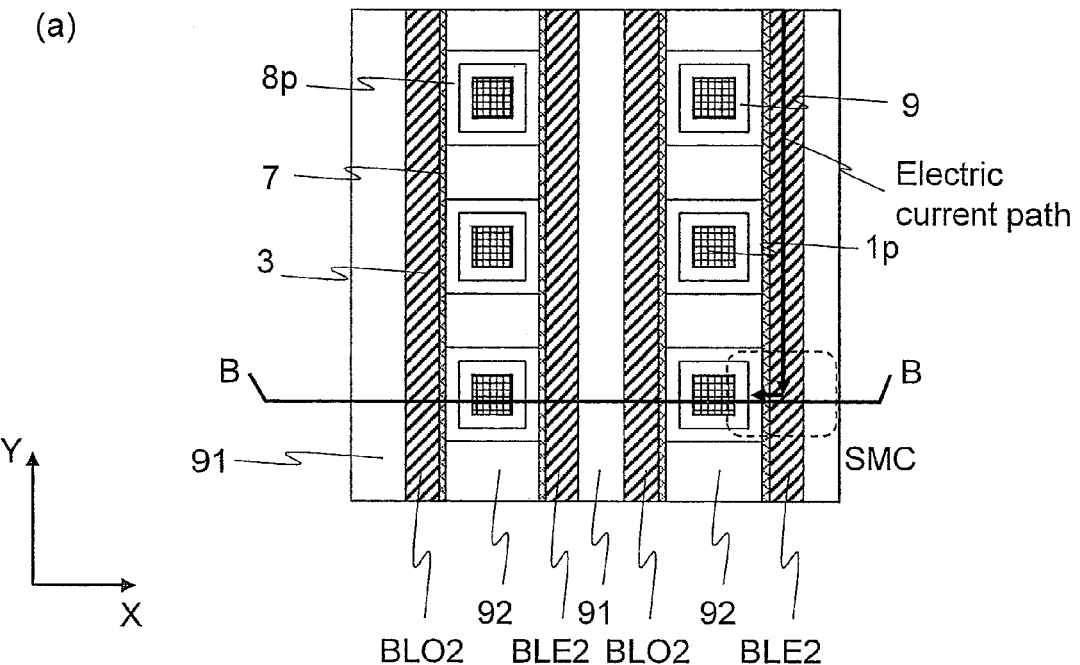
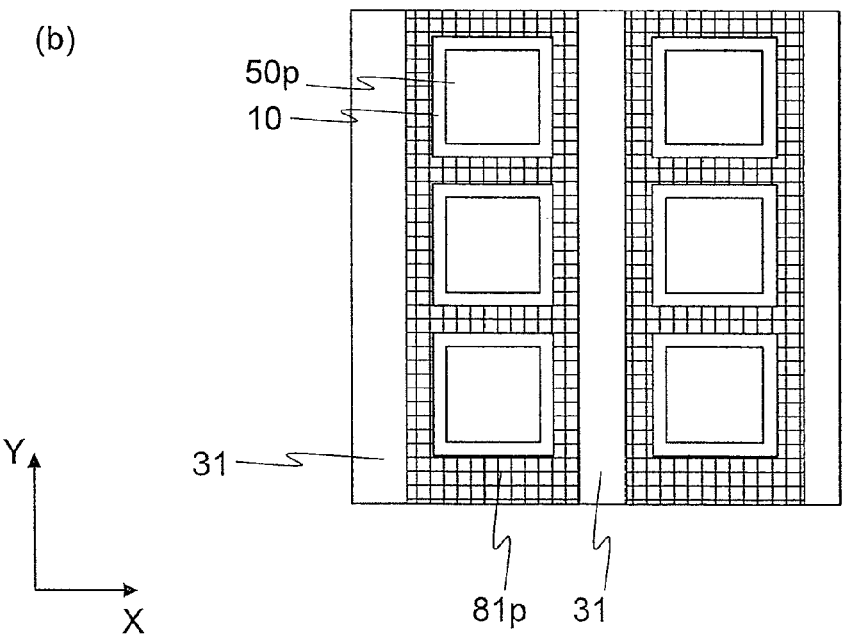

FIG. 7
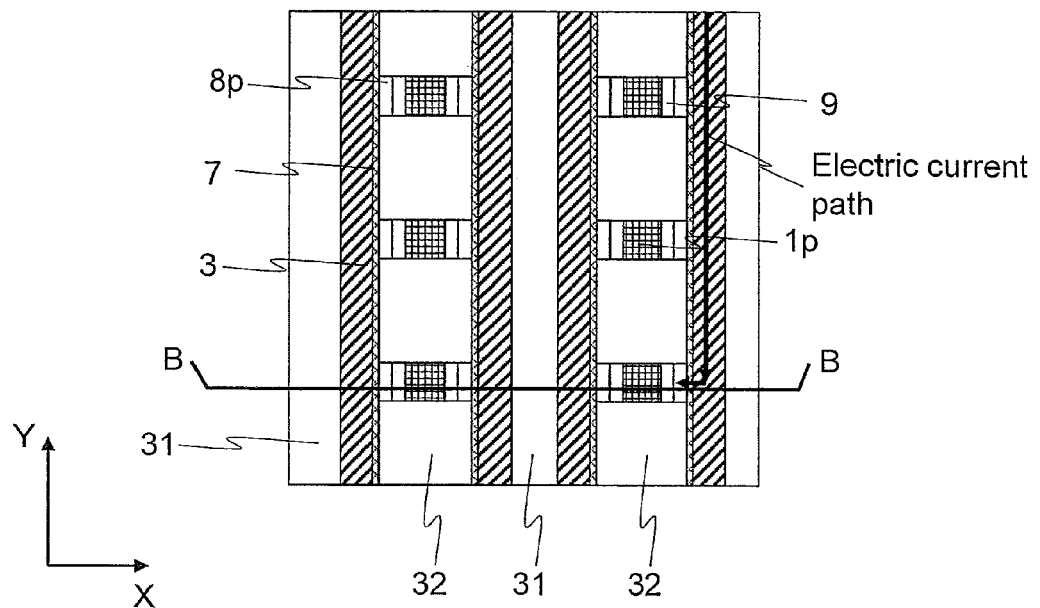
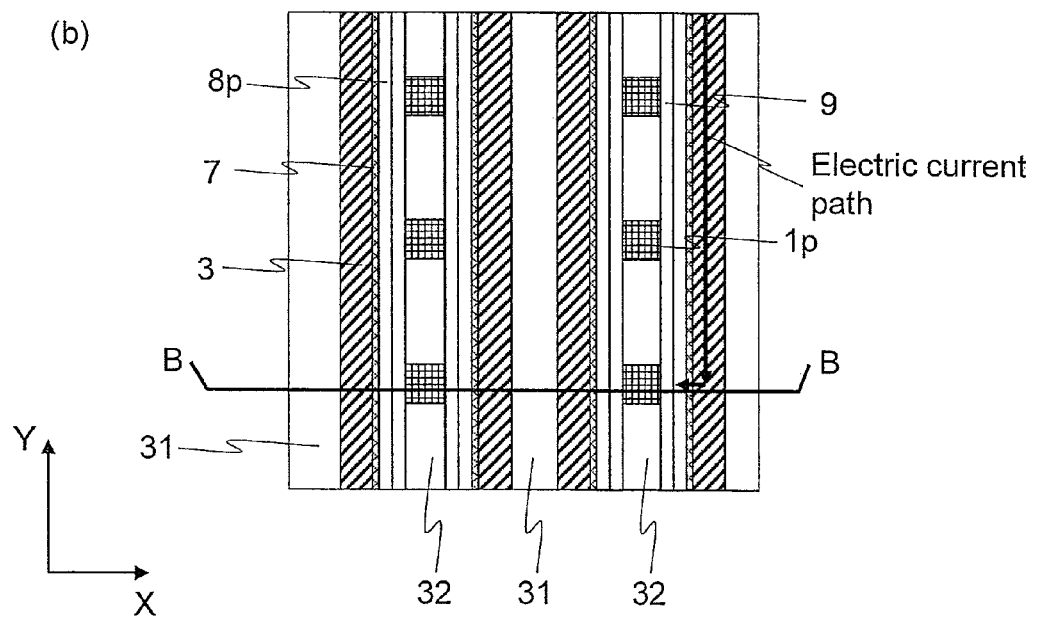

FIG. 10
(a)
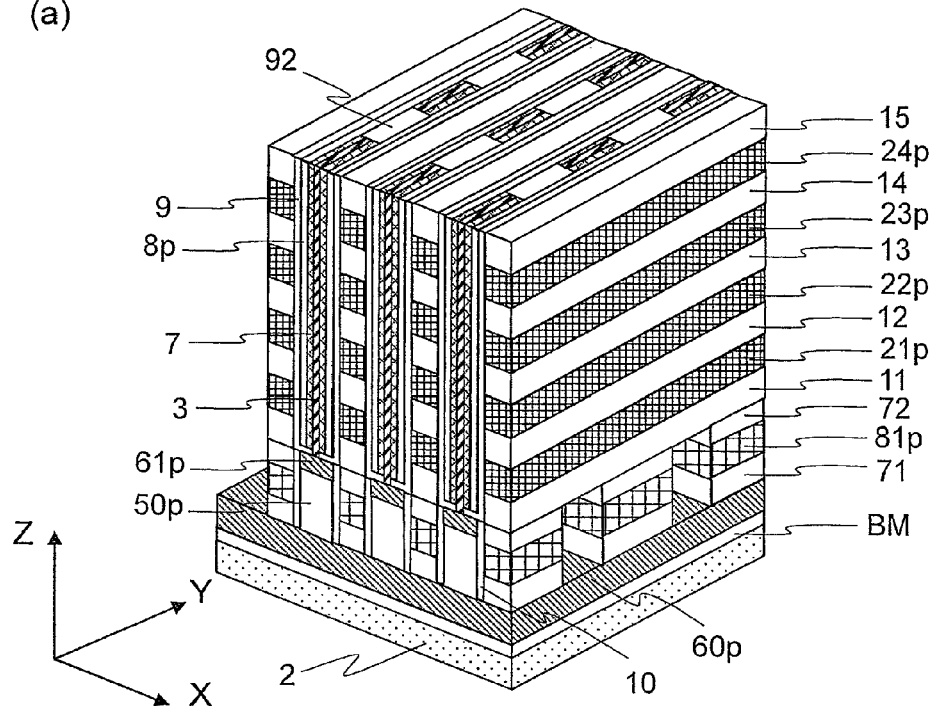
(b)
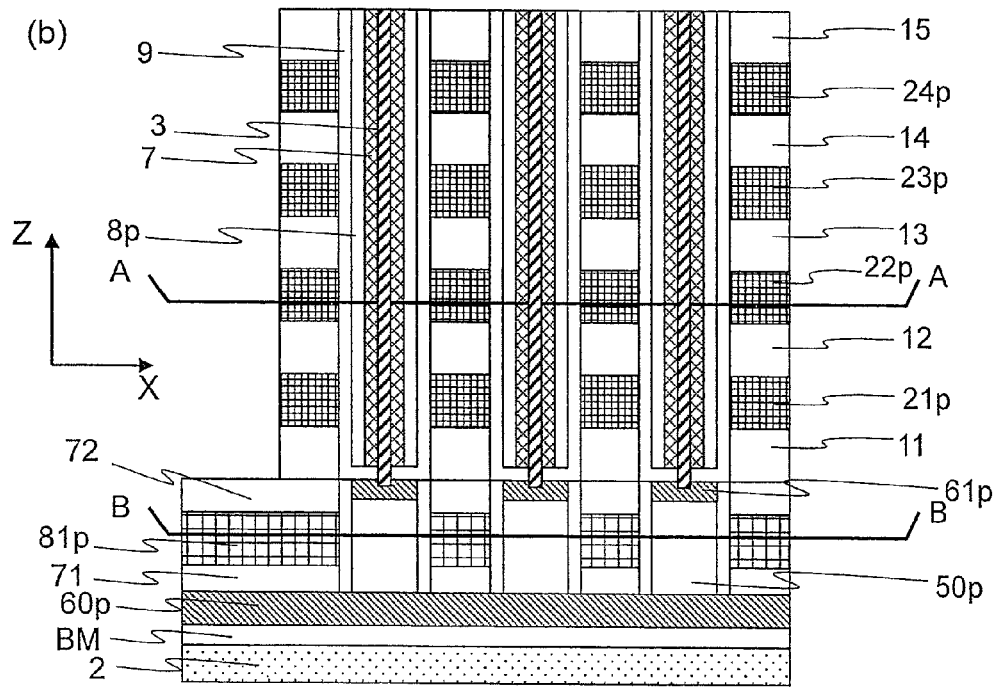

FIG. 11
(a)
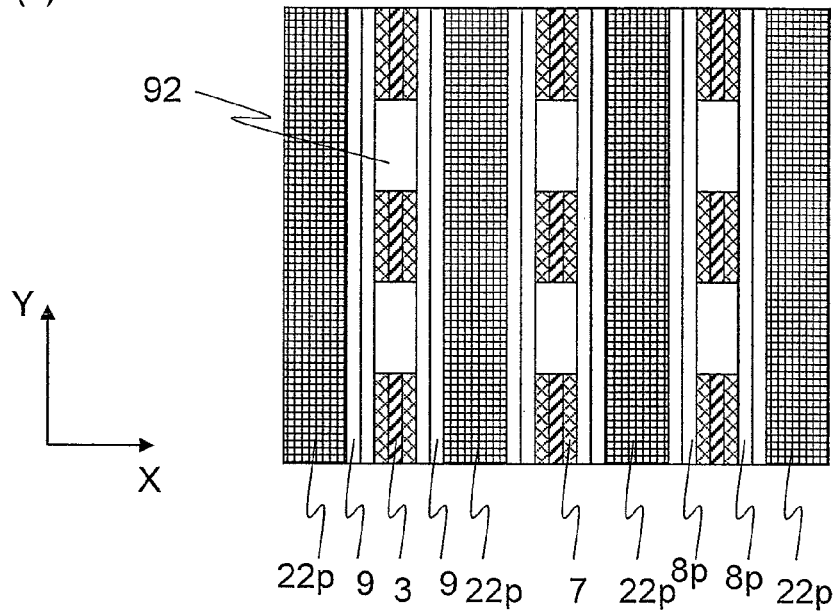
(b)
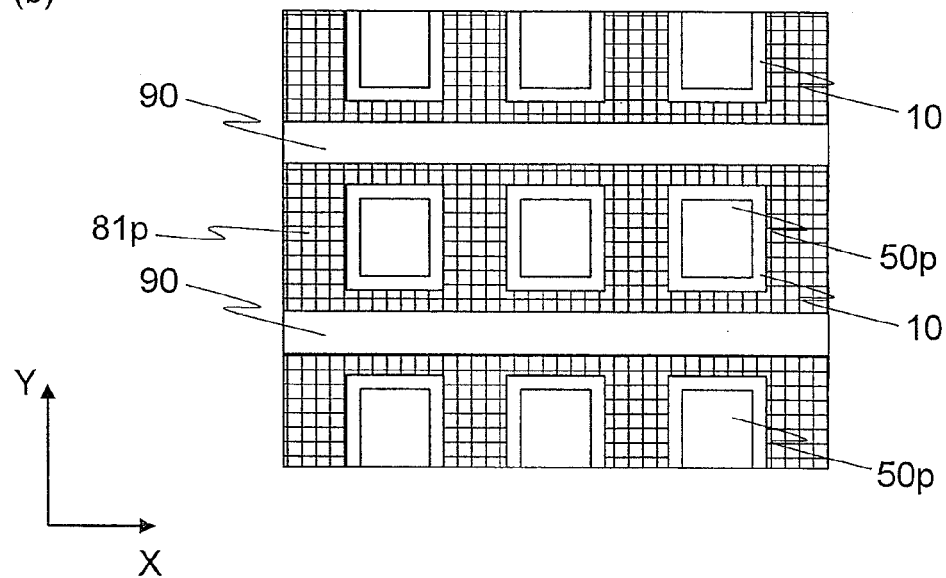

FIG. 16
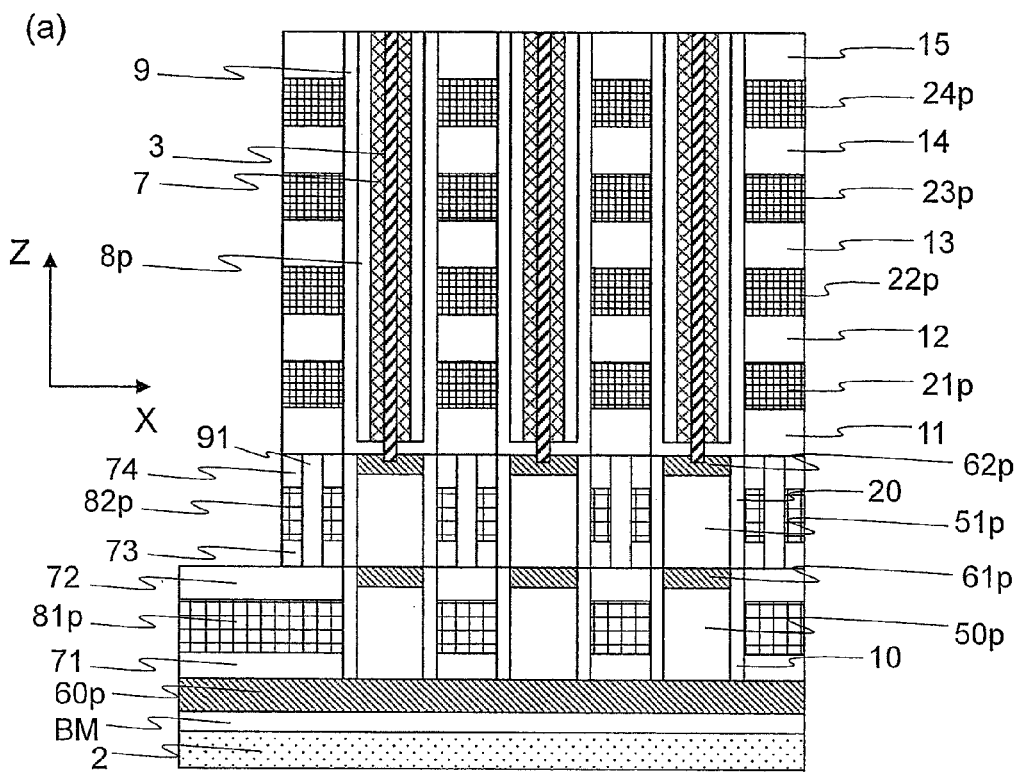
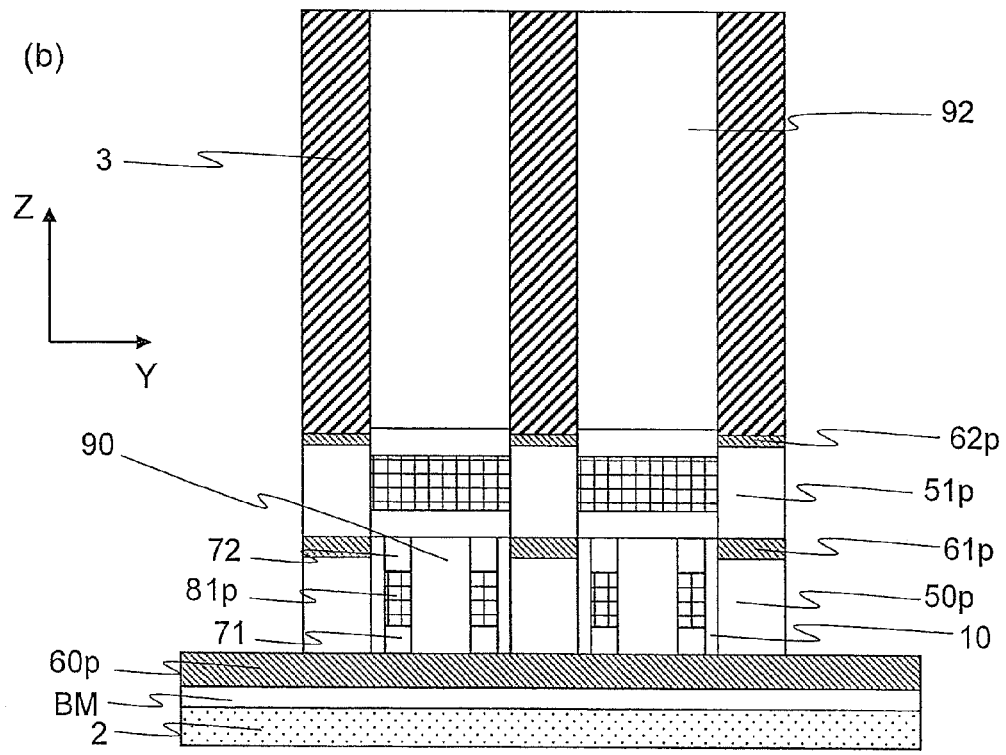

FIG. 21
(a)
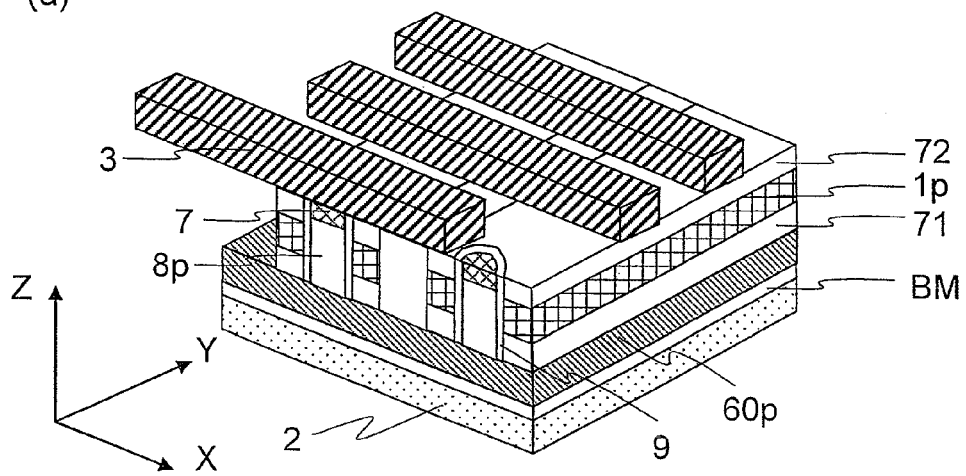
(b)
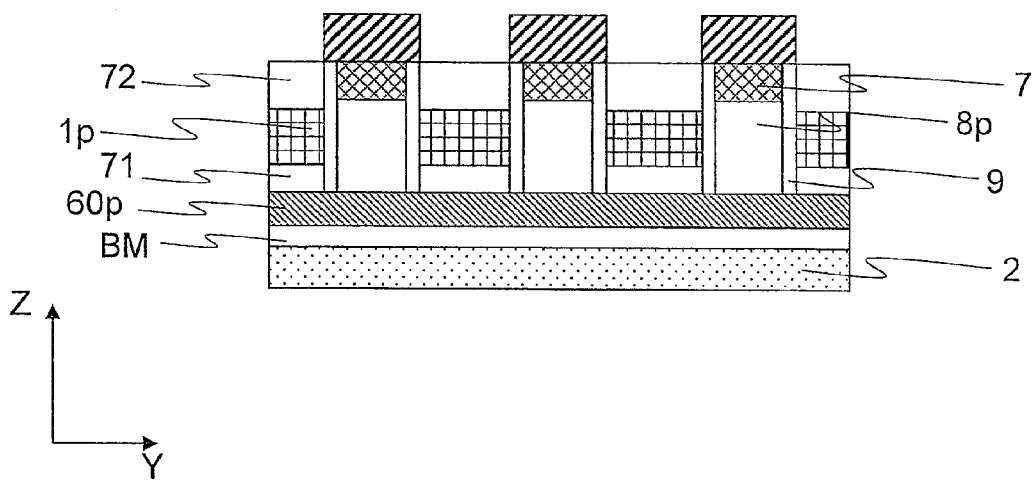

SEMICONDUCTOR MEMORY DEVICE

CLAIM OF PRIORITY

The present application claims priority from Japanese patent application JP 2012-104701 filed on May 1, 2012, the content of which is hereby incorporated by reference into this application.

BACKGROUND OF THE INVENTION

1. Field of the Invention

The present invention relates to a semiconductor memory device.

2. Background Art

In recent years, phase-change memories using chalcogenide materials as recording material have been actively researched. Phase-change memory is a type of resistance memory that stores information utilizing that the recording material between electrodes has different resistance states.

Phase-change memory stores information utilizing that a resistance value of phase-change materials such as $Ge_2Sb_2Te_5$ varies between an amorphous state and a crystalline state. The resistance is high in the amorphous state and low in the crystalline state. Thus information is read from the memory by: providing an electric potential difference between both ends of the element; measuring an electric current flowing through the element; and determining high resistance state/low resistance state of the element.

In phase-change memories, data is rewritten by changing an electric resistance of a phase-change film into a different state using a Joule heat generated by an electric current. A reset operation, i.e. an operation changing the element into the amorphous state of high resistance, is performed by providing a large electric current for a short time to dissolve the phase-change material and after that by rapidly decreasing the electric current to rapidly cool the element. On the other hand, a set operation, i.e. an operation changing the element into the crystalline state of low resistance, is performed by providing, for a long time, an electric current that is sufficient to keep the phase-change material in a crystallization temperature. The phase-change memory is suitable for miniaturization in principle because the electric current that is required to change the state of the phase-change film becomes smaller as the memory becomes more miniaturized. Thus it has been actively researched.

PCT Publication WO 2011/074545 describes, as an example of phase-change memory, a technique in which separated phase-change material layers are configured to be capable of storing information individually by: forming a channel layer extended in a direction vertical to a substrate between stripe-like stacked gates; separating, by insulating layers, phase-change materials contacting with each of the opposed channel layers; and using a selection transistor controlling electric currents flowing through each of the channel.

JP Patent Publication (Kokai) 2008-160004 A discloses, as a method for high density integration of a memory utilizing variable resistance elements, a configuration in which: a plurality of through holes penetrating all layers are formed by bulk processing in a stacked structure in which gate electrode materials and insulating layers are stacked alternately; and inside the through holes a gate insulating film, a channel layer, and a phase-change film are laminated and processed.

JP Patent Publication (Kokai) 2011-114016 A discloses, although as an example of a resistance memory other than phase-change memory, an example in which: a channel layer extended in a direction that is vertical to a substrate is formed between stripe-like stacked gates; and a variable resistance material is formed in a region sandwiched between the opposed channel layers.

Patent Literature 1: PCT Publication WO 2011/074545
Patent Literature 2: JP Patent Publication (Kokai) 2008-160004 A
Patent Literature 3: JP Patent Publication (Kokai) 2011-114016 A

SUMMARY OF THE INVENTION

The memories described in PCT Publication WO 2011/074545, JP Patent Publication (Kokai) 2008-160004 A, and JP Patent Publication (Kokai) 2011-114016 A have technical problems as described below. The problem is related to a fact that a channel length of a cell transistor selecting one memory cell becomes equal to a length of a variable resistance material, such as phase-change material, along an electric current path, and both of them are not capable of being controlled individually.

In operations of read/rewrite, an electric potential difference is provided to both ends of a chain cell with a cell transistor of a selected cell being OFF state and a cell transistor of a non-selected cell being ON state. As a result, an electric current flows through a variable resistance material, such as phase-change material, in the selected cell and an electric current flows through a channel of the cell transistor in the non-selected cell. Accordingly, the cell transistors are required to achieve both of a source-drain breakdown voltage in the OFF state necessary for the selected cell and an electric current driving power in the ON state necessary for the non-selected cell. The source-drain breakdown voltage (VBDS) of the cell transistor must be larger than voltages (VREAD, VSET, VRESET) required to be applied to both ends of the variable resistance element in each of read operation, set operation (low resistance operation), and reset operation (high resistance operation). Therefore, formulas (1) (2) (3) described below must be satisfied.

$$VBDS > VREAD \quad (1)$$

$$VBDS > VSET \quad (2)$$

$$VBDS > VRESET \quad (3)$$

In memory cells described in PCT Publication WO 2011/074545, JP Patent Publication (Kokai) 2008-160004 A, and JP Patent Publication (Kokai) 2011-114016 A, a distance between electrodes of the variable resistance material formed parallel to the channel becomes longer simultaneously as the channel length of the cell transistor is made longer to improve the source-drain breakdown voltage. Thus the voltages required to be applied to both ends of the variable resistance material in read/rewrite operations also increase. Thus it is difficult to achieve all of the formulas (1) to (3) by optimizing the device structure. Therefore, high level performance for ON/OFF characteristics of the cell transistor and for low electric current/low electric voltage rewriting characteristics of the variable resistance material is required.

The present invention is made in accordance with above-mentioned technical problems, and is directed to achieve high density with simple manufacturing process to decrease bit costs of memory.

A semiconductor memory device according to a first aspect of the present invention includes a variable resistance material layer and a channel layer that are connected in series between a first diffusion layer and a metal wire, thereby separating the metal wire and a channel semiconductor layer.

A semiconductor memory device according to a second aspect of the present invention includes a variable resistance material layer electrically connecting channel semiconductor layers opposed to each other in a first direction and electrically connecting channel semiconductor layers adjacent to each other in a second direction, wherein a plurality of the channel semiconductor layers is disposed in the second direction.

According to the semiconductor memory device of the present invention, density of the memory cell array is improved and memory capacity is made larger, thereby reducing bit costs.

Technical problems, configurations, and advantageous effects other than those mentioned above will be apparent according to the descriptions of embodiments below.

BRIEF DESCRIPTION OF THE DRAWINGS

FIG. 1 is a diagram explaining a configuration of a memory cell array portion of a semiconductor memory device according to a first embodiment.

FIG. 4 is a cross-sectional diagram of FIG. 3.

FIG. 7 is a diagram illustrating a modification of the memory cell structure shown in FIG. 4(a).

FIG. 10 is a diagram illustrating a configuration example in which a bit line 3 is extended and formed in a direction vertical to a substrate surface.

FIG. 11 is a cross-sectional diagram of FIG. 10.

FIG. 16 is a cross-sectional diagram of FIG. 15.

FIG. 21 is a diagram illustrating another configuration example exhibiting effects similar to that of second embodiment.

DETAILED DESCRIPTION OF THE PREFERRED EMBODIMENTS

Figure 2:
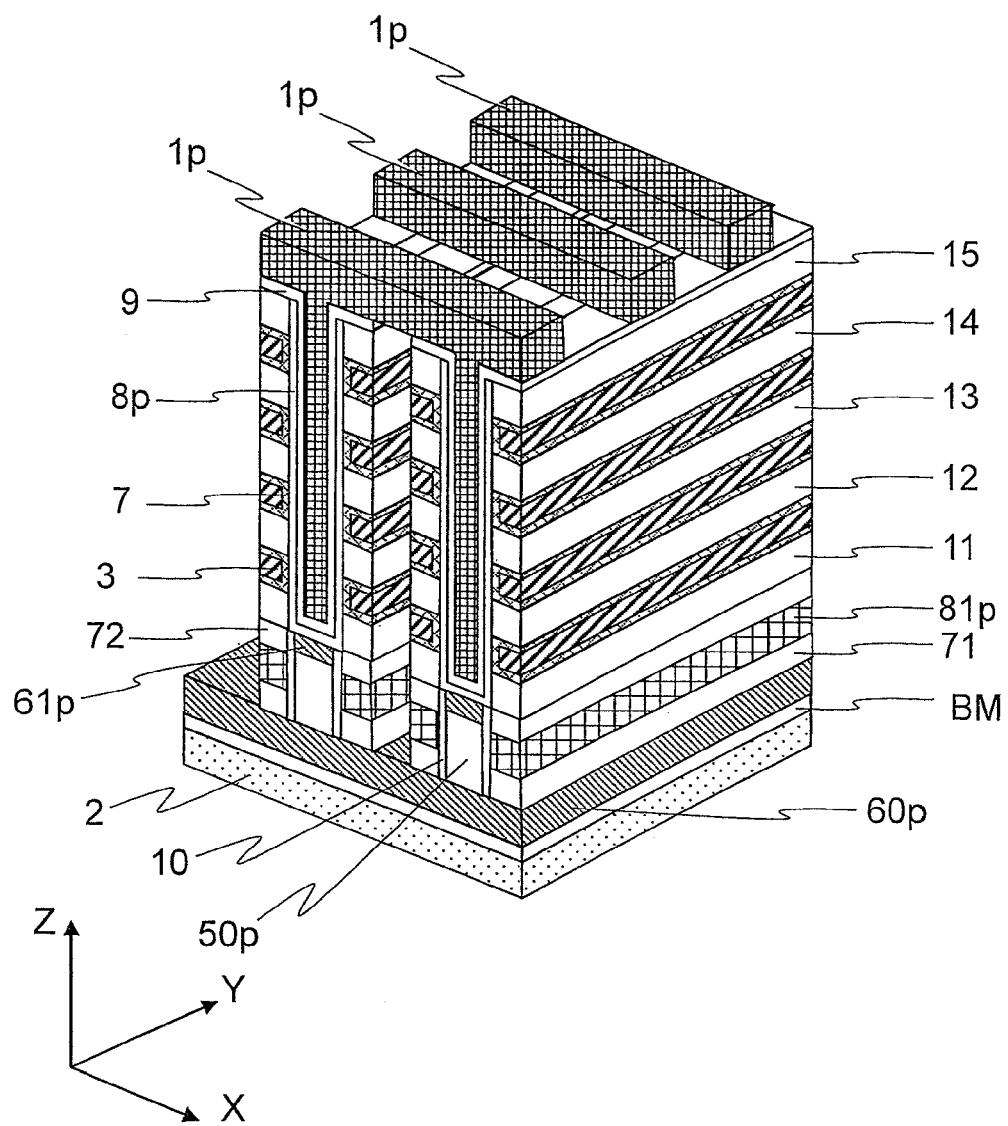
FIG. 2 is a diagram illustrating a configuration example in which a bit line 3 is stacked vertical to a substrate surface.

Hereinafter, embodiments of the present invention will be described in accordance with figures. Note that in all figures for explaining the embodiments, same reference signs will be given to components having same functions, and repetitive explanation thereof will be omitted. In addition, it is noted that portions explaining specific configurations are not limited to each of the embodiments, and common configurations will bring same effects.

First Embodiment

FIG. 1 shows a configuration of a memory cell array portion of a semiconductor memory device according to a first embodiment of the present invention. FIG. 1(a) is a schematic diagram illustrating a structure of the memory cell array stereo graphically, and FIG. 1(b) is an equivalent circuit diagram thereof.

In FIG. 1(a), a portion is shown in which an electrode 3 that works as a bit line, a gate polysilicon 1p that works as a cell gate electrode, a gate insulating film 9, a channel semiconductor layer 8p, and a variable resistance material layer 7 are provided. In FIG. 1(a), a plurality of bit lines and a plurality of gate electrodes are formed so that they are extended in directions perpendicular to each other. For example, in a case where the bit line 3 and the cell gate electrode 1p are formed in a main surface (substrate surface) on the semiconductor substrate, both of the bit line 3 and the cell gate electrode 1p can be formed in 2F pitch with a minimum processing size of F. Thus a memory cell with a cell area size of $4F^2$ can be formed.

As a variable resistance material, a ReRAM material comprising materials such as a phase-change material or a metal oxide can be used. In a case using a phase-change material, information can be stored utilizing that a phase-change material such as $Ge_2Sb_2Te_5$ has different resistance values in an amorphous state and in a crystalline state. An operation changing the variable resistance material from the amorphous state with high resistance into the crystalline state with low resistance, i.e. a set operation, is performed by: heating the variable resistance material in the amorphous state into a temperature above a crystallization temperature; and keeping the temperature for more than about $10^{-6}$ seconds to change the material into the crystalline state. The variable resistance material in the crystalline state can be changed into the amorphous state by: heating the material into a temperature above a melting temperature to make the material into a liquid state; and rapidly cooling the material.

The memory array can be configured as illustrated in the equivalent circuit diagram of FIG. 1(b). The memory array is configured so that an electric voltage is commonly applied, from a diffusion layer (not shown) formed outside of the memory array, to all of the channel semiconductor layers 8p in the memory array. On the other hand, the memory array is configured so that independent electric voltages can be applied respectively to a plurality of the cell gate electrodes 1p extended in a Y direction and to a plurality of the bit lines 3 extended in a X direction. It allows each of memory cells to operate selectively even when commonly applying electric voltages to whole of the memory array from the diffusion layer.

Note that since an electric voltage application circuit supplying an electric potential to each of layers, electrodes, metal wires, and the like can be configured using commonly known techniques in the technical field, its detailed configuration is not explained and illustrated specifically. It applies to figures and embodiments below.

FIG. 1(b) shows electric voltage conditions for a read operation, a set operation, and a reset operation. In order to set the channel semiconductor layer configuring a selected cell SMC to an ON state, the electric voltage application circuit applies an electric voltage to the cell gate electrode 1p. The electric voltage application circuit applies an OFF voltage to other cell gates so that the channel semiconductor layer 8p doesn't transit to an inverted state. The electric voltage application circuit applies 0V to a N-type diffusion layer (NDIF) for supplying electric power to the channel semiconductor layer 8p, and applies a read voltage VREAD to the bit line 3 where the SMC is connected. It allows an electric current to flow between the bit line 3/the NDIF through the selected cell SMC. Thus information can be read out by detecting a resistance of the SMC. The electric voltage application circuit applies, instead of the VREAD, VSET and VRESET respectively when performing the set operation and the reset operation. At this time, the bit lines other than the selected bit line are set into a floating state.

It is necessary to prevent a sneak electric current from flowing between the selected bit line 3 and the NDIF through the non-selected bit line 3 and the non-selected channel semiconductor layer 8p. The sneak electric current can be restricted by applying the OFF voltage to the cell gate electrode 1p to set the non-selected channel semiconductor layer into the OFF state. As a result, all of electric currents flowing between the selected bit line and the NDIF can be configured to flow through the SMC. Each of memory cells can be operated by appropriately selecting bit lines and gate electrode wires in which electric voltages are applied in accordance with selected memory cells.

Lengths of electric current path are different depending on locations of memory cells in the memory array. Focusing on the channel length in the electric current path, the length of the channel semiconductor layer 8p through which an electric current flows is long in a case where the CELLA operates, and is short in a case where the CELLB operates. The length of the electric current path is also different for the bit line 3 depending on location. Thus an electric voltage drop at the channel semiconductor layer 8p and the bit line 3 is different depending on location. The influence of the difference in the electric voltage drop in wire portions can be compensated by changing VREAD, VSET, VRESET, and the ON voltage applied to the gate electrode depending on location of the selected cell. In other words, a slightly higher VREAD, VSET, VRESET are used for cells at a location where the electric voltage drop at the channel semiconductor layer 8p and the bit line 3 is large, and a slightly low VREAD, VSET, VRESET are used for cells at a location where the electric voltage drop at the channel semiconductor layer 8p and the bit line 3 is small. Such electric voltage adjustment can be also performed for cells described below that are modifications of FIG. 1.

The manufactured semiconductor memory device has a cell area size of $4F^2$, thus can be made highly densified. In addition, the semiconductor memory device doesn't have selection devices for each of memory cells on the semiconductor substrate, thus can be stacked. Therefore, it is suitable for achieving low bit costs.

It is not necessary to form, on the main semiconductor surface, the bit line 3 and the cell gate electrode 1p of the semiconductor memory device shown in FIGS. 1(a) and 1(b). Other method can be used as described below.

FIG. 2 is a diagram illustrating a configuration example in which the bit line 3 is stacked vertical to the substrate surface. In FIG. 2, stacked electrodes 3 that work as bit lines extended in a Y direction, insulating films 11, 12, 13, 14, 15 separating the bit lines 3 in a Z direction vertical to a semiconductor substrate, gate polysilicons 1p that work as cell gates extended in the Z direction vertical to the semiconductor substrate, channel semiconductor layers 8p formed such that they surround the gate polysilicons 1p through gate insulating layers 9, a plate electrode 2, a barrier metal BM, N-type polysilicon layers 60p and 61p, a channel polysilicon layer 50p controlling connection and insulation between the plate electrode 2 and the channel semiconductor layer 8p, a gate insulating film 10, and a selection transistor formed with the gate polysilicon 81p are shown as a stereoscopic schematic diagram.

At the portion where the channel semiconductor layer 8p and the bit line 3 intersect, both of them are connected through a variable resistance material layer 7. A resistance change in the variable resistance material layer 7 at this portion allows storing information, as the memory cell in FIG. 1.

Figure 3:
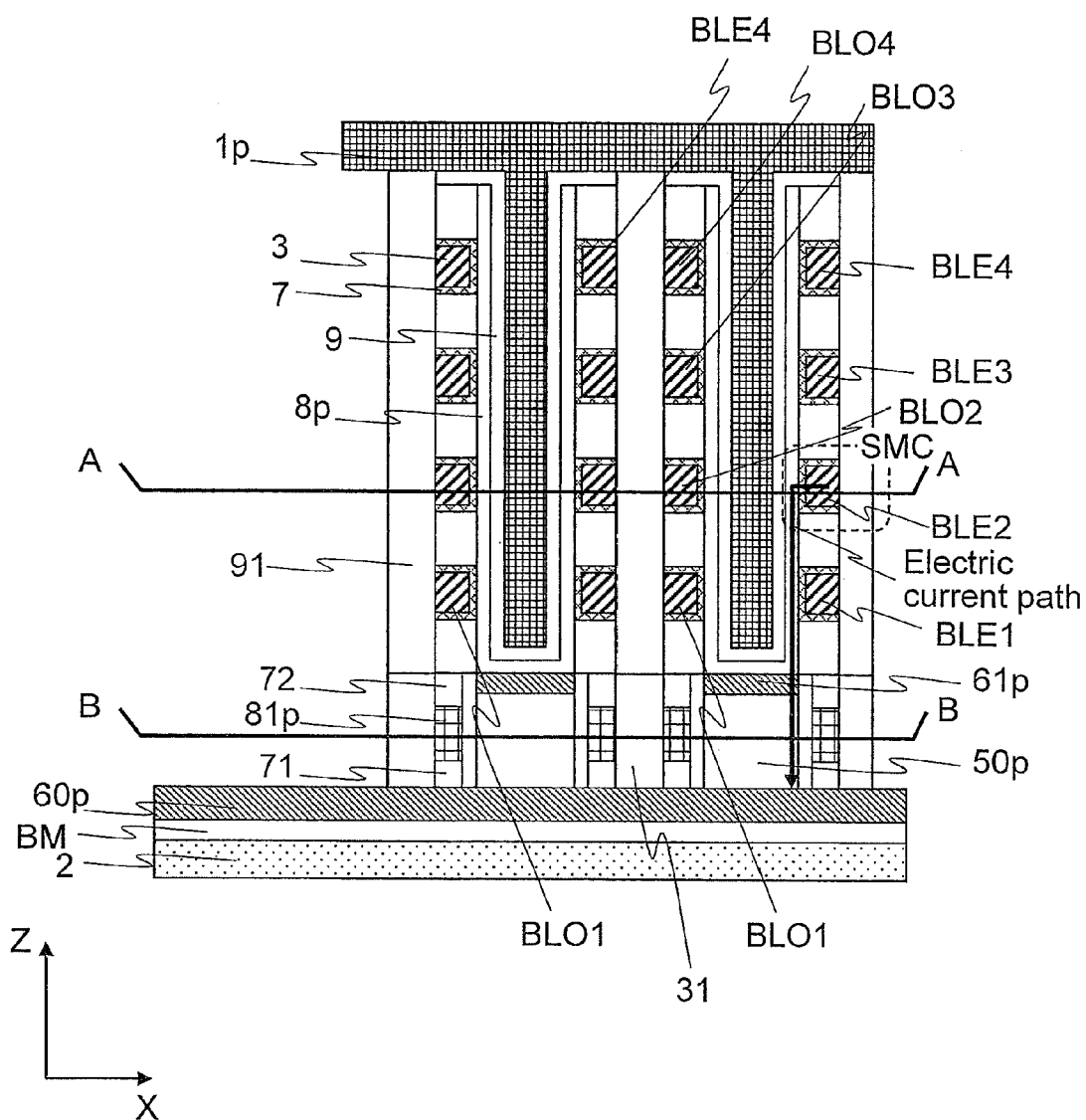
FIG. 3 is a X-Z cross-sectional diagram on a gate polysilicon 1p in FIG. 2.

FIG. 3 is a X-Z cross-sectional diagram on the gate polysilicon 1p in FIG. 2. Although omitted for the sake of clarification in FIG. 2, the gate polysilicons 81p adjacent to each other in the X direction are insulated from each other by an insulating film 31. The bit lines 3 are separated by an insulating film 91 on the side opposite to the channel semiconductor layer 8p in the X direction. The bit lines 3 of each layer are separated from each other. In addition, two of the bit lines 3 opposing in the X direction through the gate polysilicon 1p are separated from each other so that independent electric potentials can be supplied to them. For example, the bit line in the second layer is separated into two lines of BLO2, BLE2. On the other hand, every alternate bit line can be connected with each other such as BLO2s or BLE2s.

In FIG. 3, an electric current path is shown in a case where a memory cell at the portion where the bit line BLE2 in the second layer and the channel semiconductor layer 8p intersect is a selected cell SMC. Electric voltage conditions implementing a select operation will be described later.

FIG. 4 is a cross-sectional diagram of FIG. 3. FIG. 4(a) is a A-A cross-sectional diagram of FIG. 3, and FIG. 4(b) is a B-B cross-sectional diagram of FIG. 3. An insulating film 92 is an insulating layer electrically separating the channel semiconductor layers 8p in the Y direction.

In FIG. 4(a), it appears that the channel semiconductor layer 8p is formed so that it surrounds the gate polysilicon 1p through the gate insulating film 9. At the intersection of the bit line 3 and the channel semiconductor layer 8p, the channel semiconductor layer 8p and the bit line 3 are connected with each other at one side in the X direction of outer perimeter of the channel semiconductor layer 8p through the variable resistance material layer 7.

In FIG. 4(b), the gate polysilicon layer 81p of the selection transistor is extended in the Y direction. A hole is formed inside the gate polysilicon layer 81p, and a channel polysilicon layer 50p is formed through the gate insulating film 10 inside the hole.

Figure 5:
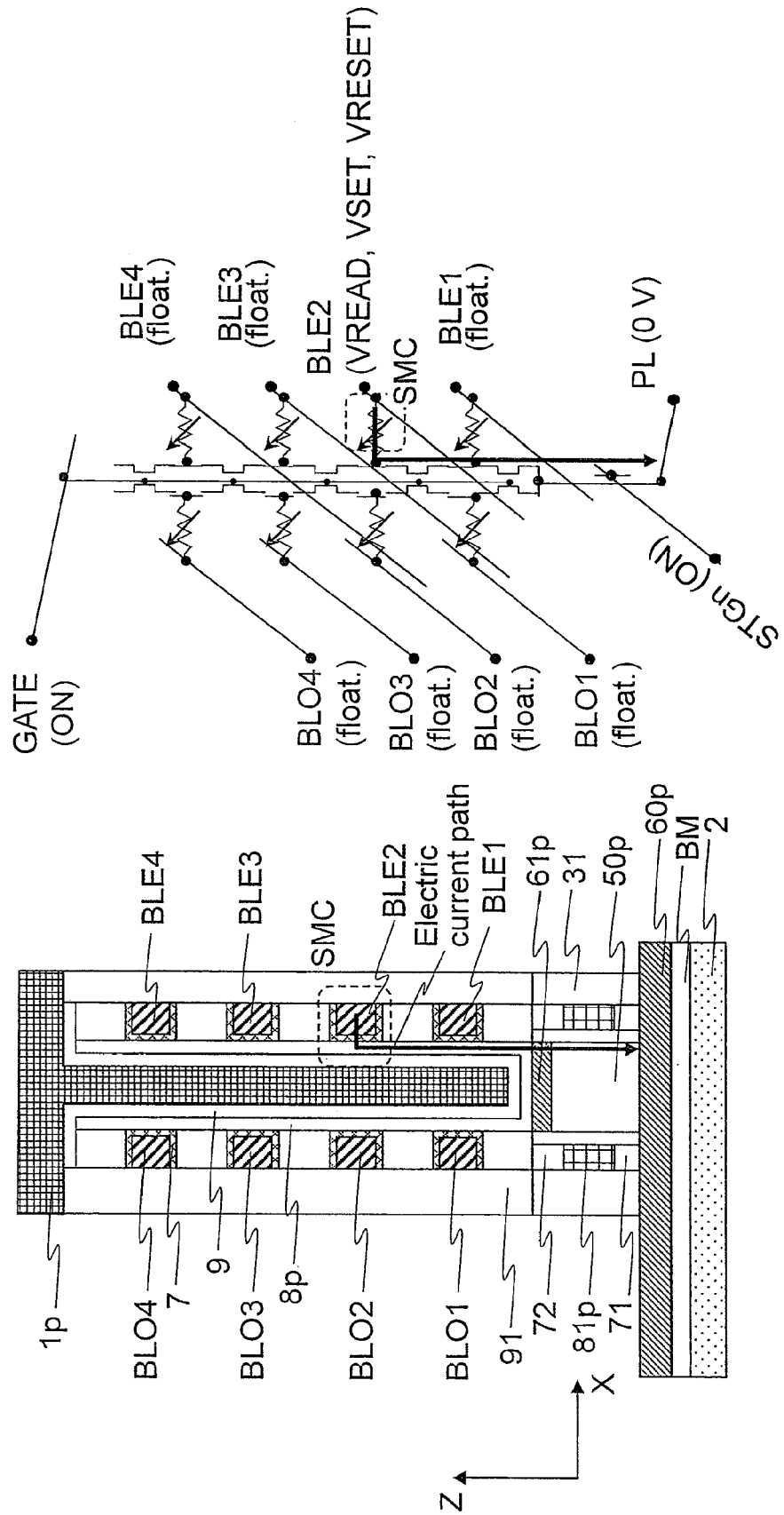
FIG. 5 shows an electric voltage condition that allows a selected cell SMC to operate.

FIG. 5 shows electric voltage conditions for operating the selected cell SMC. An ON voltage is applied to the cell gate electrode (1p) to invert the channel semiconductor layer 8p. The ON voltage is applied to the gate polysilicon 81p of the selection transistor STGn with which the channel semiconductor layer 8p including the SMC is connected, so that the plate electrode and the channel semiconductor layer 8p are set into a conductive state. Bit lines other than BLE2 are set into a floating state. Electric voltages VREAD, VSET, VRESET corresponding to a read operation, a set operation, a reset operation are applied to the bit line BLE2, thereby allowing the SMC to operate.

Figure 6:
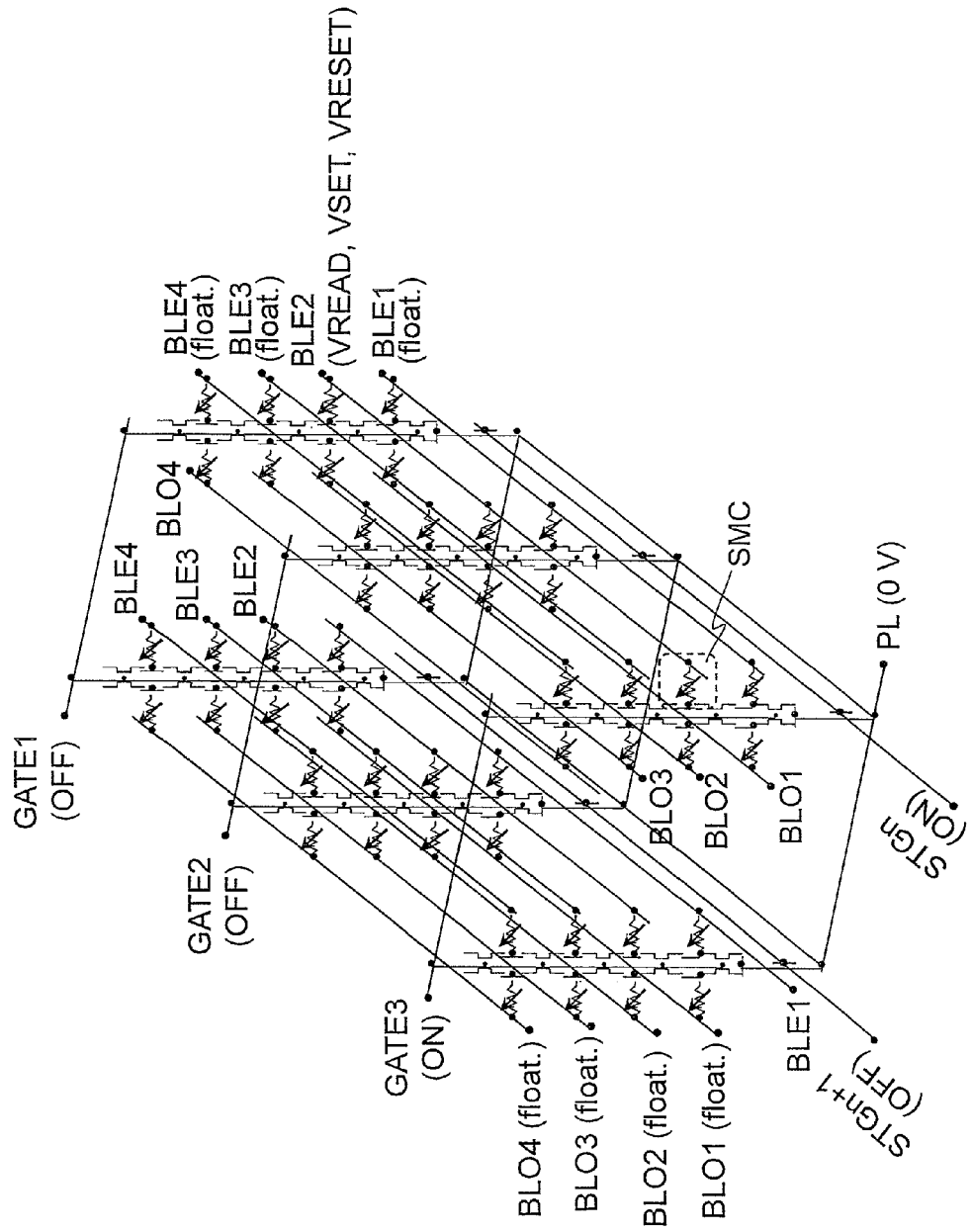
FIG. 6 is a diagram explaining a select operation in a memory array in which a plurality of equivalent circuits shown in FIG. 5 is aligned in a X direction and a Y direction respectively.

FIG. 6 is a diagram explaining a select operation in a memory array in which a plurality of the equivalent circuit shown in FIG. 5 is aligned in a X direction and in a Y direction respectively. An OFF voltage is applied to the cell gate electrode 1p with which the selected cell SMC doesn't contact. For selection transistors that are not connected with the channel semiconductor layer 8p with which the selected cell SMC contact, the OFF voltage is applied to the gate polysilicon 81p. As such, the memory cell can be selected that is contacted with the channel semiconductor 8p in which selection transistors (STGn, STGn+1) extended in the Y direction and the cell transistor extended in the X direction are both set into the ON state.

At the location where the cell transistor is OFF, no electric current flows between the bit line and the channel semiconductor layer even when applying an electric voltage to the bit line because no inverted layer if formed in the channel semiconductor layer 8p. In a location where the selection transistor is in the OFF state such as STGn+1 in FIG. 6, there is no electron flowing from the N-type diffusion layer 60p into the channel semiconductor layer 8p. Thus the channel semiconductor layer 8p keeps the high resistance state even when applying the ON voltage to the gate electrode 1p. Accordingly, no electric current flows between the bit line and the channel semiconductor layer 8p. In other words, only at the location where both of the cell transistor and the selection transistor are set into the ON state, an electric current flows by applying an electric voltage to the bit line. Thus only the SMC is selected from whole of the memory array to operate, according to the operation shown in FIG. 5.

In FIGS. 3 to 6, if bit lines such as BLO1s or BLE1s are not wired with each other, each memory cell can be selected without using selection transistors for selecting memory cells. It is because selection in the X direction can be performed by independent bit lines 3. However, wiring bit lines 3 with each other is beneficial in that an area size of a driver circuit for the bit lines 3 can be reduced, because the number of electric power sources for supplying electric powers to each of bit lines that are required for array operation can be reduced. Therefore, in order to increase the number of stacked bit lines 3 to facilitate densification of the memory cell, it is rather preferred, in some cases, to benefit from effects of low costs resulting from wiring bit lines with each other to reduce the area size of chips even under increased number of processes to form selection transistors for selecting memory cells.

FIG. 7 is a diagram illustrating a modified example of the memory cell structure shown in FIG. 4(a). The equivalent circuit of the FIG. 4(a) is the same as an equivalent circuit of FIG. 7. FIG. 7(a) illustrates an example in which the channel semiconductor layer 8p is provided only at one side in a X direction of the cell gate electrode 1p, and the channel semiconductor layer 8p corresponding to each of the cell gate electrode 1p is separated in a Y direction. FIG. 7(b) illustrates an example in which the channel semiconductor layer 8p corresponding to each of the cell gate electrode 1p is connected in the Y direction in FIG. 7(a).

The structure in FIG. 4(a) allows, when an electric current flows in the Z direction in the channel semiconductor layer 8p, an electric current to flow with a wide channel width using both sides in the X direction and the Y direction of the channel semiconductor layer 8p. Thus an electric current larger than that of FIG. 7(a) (b) can be driven, even when using the same voltage between source/drain. Therefore, a low voltage operation can be achieved even when increasing the number of stacks, thereby suppressing increase in area size of peripheral circuits.

In the structure shown in FIG. 7(a) (b), the channel semiconductor layer 8p is separated in the X direction both into the +X side and the −X side. The cell gate electrode 1p and the channel semiconductor layer 8p are contacted with each other through the gate insulating film 9 only at one side in the X direction. Accordingly, the width of inverse layer formed by applying the ON voltage to the cell gate electrode 1p is narrower than that in the case of FIG. 4(a), thus the same voltage between source/drain allows smaller electric currents. Compared with FIG. 4(a), increasing the number of stacks increases the operation voltage, which increases the area size of peripheral circuits. However, no channel semiconductor layer 8p is formed in both sides in the Y direction of the cell gate electrode 1p and thus a space margin is created, which is advantageous for miniaturizing in the Y direction to densify the structure.

Figure 8:
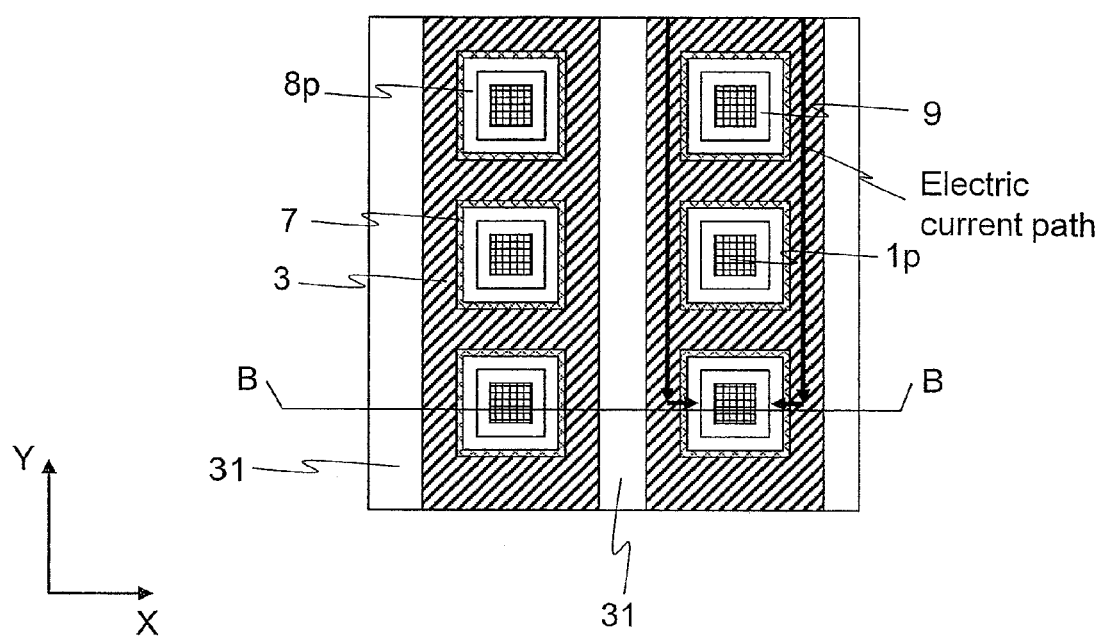
FIG. 8 is a diagram illustrating another modification of the memory cell structure shown in FIG. 4(a).

FIG. 8 is a diagram illustrating another modified example of the memory cell structure shown in FIG. 4(a). In FIGS. 2 to 7, the cell gate electrode 1p contacts with different bit lines 3 in both sides of the X direction through the gate insulating film 9 and the channel semiconductor layer 8p. However, the bit lines at both sides can be integrated as shown in FIG. 8.

In the examples of FIGS. 2 to 7, two memory cells can be formed at the intersection of the channel semiconductor layer 8p and the bit line. On the other hand, in the example of FIG. 8, only one memory cell can be formed at the intersection of the channel semiconductor layer 8p and the bit line 3. Accordingly, in terms of memory cell density in the memory array, the configuration in FIG. 8 has lower density than that of the configurations in FIGS. 2 to 7. However, the bit line 3 that is separated in FIGS. 2 to 7 is wired at the boundary portion of the channel semiconductor layers 8p adjacent to each other in the Y direction. Thus a resistance of the bit line 3 per unit length in the Y direction can be reduced. Therefore, the memory array can be enlarged in the Y direction, which is advantageous in that the area size of peripheral circuits can be reduced by commonly using driver circuits, sensing circuits, and the like.

Figure 9:
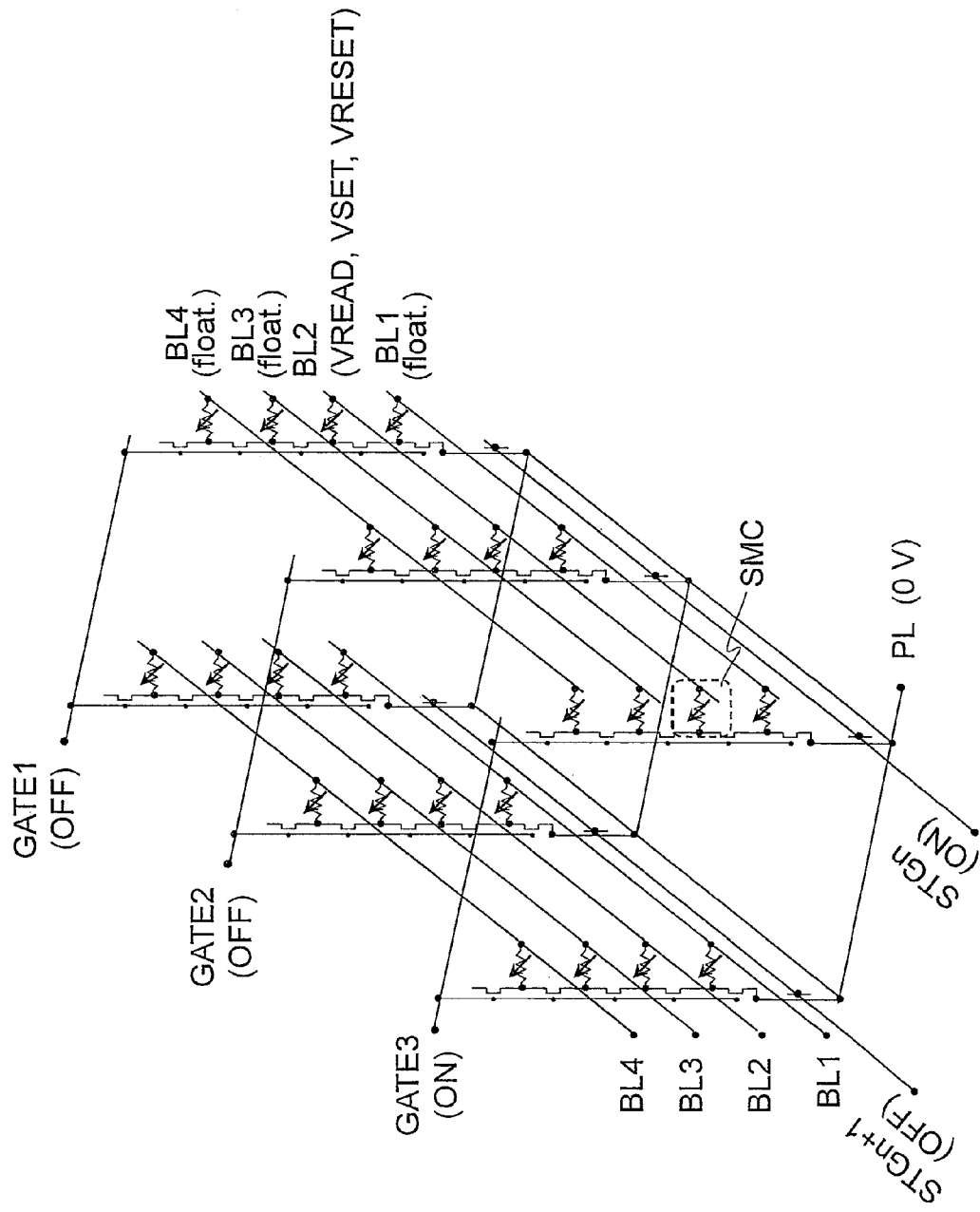
FIG. 9 is a diagram explaining a select operation in a memory array in which a plurality of equivalent circuits of the memory cell shown in FIG. 8 is aligned in a X direction and a Y direction respectively.

FIG. 9 illustrates a diagram explaining a select operation in a memory array in which a plurality of the equivalent circuit shown in FIG. 8 is aligned in a X direction and a Y direction respectively. The equivalent circuit is similar to FIG. 6. However, the select operation can be achieved by more simplified voltage condition.

FIG. 10 is a diagram illustrating a configuration example in which the bit line 3 is extended in a direction vertical to the substrate surface. In FIGS. 2 to 9, the bit line 3 of the memory cell is extended into a direction parallel to the semiconductor substrate surface, and the cell gate electrode 1p and the channel semiconductor layer 8p are extended in the Z direction vertical to the semiconductor substrate. However, as shown in FIG. 10, the memory cell can be configured so that the bit line 3 of the memory cell is extended in the Z direction vertical to the semiconductor substrate surface, and the cell gates 21p to 24p and the channel semiconductor layer 8p are extended in a direction parallel to the semiconductor substrate.

In FIG. 10(a), stacked gate polysilicons 21p, 22p, 23p, 24p that work as cell gate electrodes extended in a Y direction, insulating films 11, 12, 13, 14, 15, bit lines 3 extended in a Z direction vertical to the semiconductor substrate, a channel semiconductor layer 8p that is formed to contact with the gate electrodes 21p to 24p through a gate insulating film 9 and is extended in the Y-Z plane, a plate electrode 2, a barrier metal BM, N-type polysilicons 60p, 61p, a channel polysilicon layer 50p controlling connection and insulation between the plate electrode 2 and the channel semiconductor layer 8p, a gate insulating film 10, a gate polysilicon layer 81p, and insulating films 71 and 72, are shown as a stereoscopic schematic diagram.

At the portion where the channel semiconductor layer 8p and the bit line 3 intersect, both of them are connected with each other through a variable resistance material layer 7. A resistance change in the variable resistance material layer 7 at this portion allows storing information, as the examples of memory cells in FIGS. 1 to 9.

FIG. 10(b) is a X-Z cross-sectional diagram of FIG. 10(a). The bit line 3 penetrates the gate insulating film 9 above the N-type polysilicon layer 61p to be connected with the N-type polysilicon layer 61p. The N-type polysilicon layer 61p is a diffusion layer at one side of a selection transistor including the gate polysilicon layer 81p as a gate and the channel polysilicon layer 50p as a channel. The other diffusion layer is the N-type polysilicon layer 60p formed on the plate electrode 2 through the barrier metal BM. Accordingly, the space between the bit line 3 and the plate electrode 2 can be switched between connection and disconnection by the selection transistor.

In FIG. 10 (a) (b), the bit line 3 is directly connected with the N-type polysilicon layer 61p. However, a metal film layer can be accessibly formed on each of the N-type polysilicon layers 61p separated for each of channels of the transistor, and the bit line 3 can be connected with the formed metal film.

FIG. 11 is a cross-sectional diagram of FIG. 10. FIG. 11(a) is a cross-sectional diagram viewed in the X-Y plane at the altitude of the gate polysilicon layer 22p in FIG. 10. FIG. 11(b) is a cross-sectional diagram in the X-Y plane at the altitude of the gate polysilicon layer 81p in FIG. 10.

In FIG. 11(a), the gate polysilicon layer 22p is extended in the Y-direction. The gate insulating film 9 and the channel semiconductor layer 8p are sequentially filled between the gate polysilicon layers 22p adjacent to each other in the X direction. The gate insulating film 9 and the channel semiconductor layer 8p have a planar shape extended in the Y-Z plane. At a side of the channel semiconductor layer 8p, the variable resistance material layer 7 and the bit line 3 are formed at the opposed side from the gate polysilicon 22p. The variable resistance material layer 7 and the bit line 3 are extended in the Z direction and are aligned with the same space separated in the Y direction. An insulating film 92 is filled between the variable resistance material layer 7 and the bit line 3 adjacent to each other in the Y direction.

In FIG. 11(b), unlike FIG. 4(b), the gate polysilicon layer 81p is extended in the X direction. A hole is formed inside the gate polysilicon layer 81p. A gate insulating film 10 and the channel polysilicon 50p are sequentially filled inside the hole.

Figure 12:
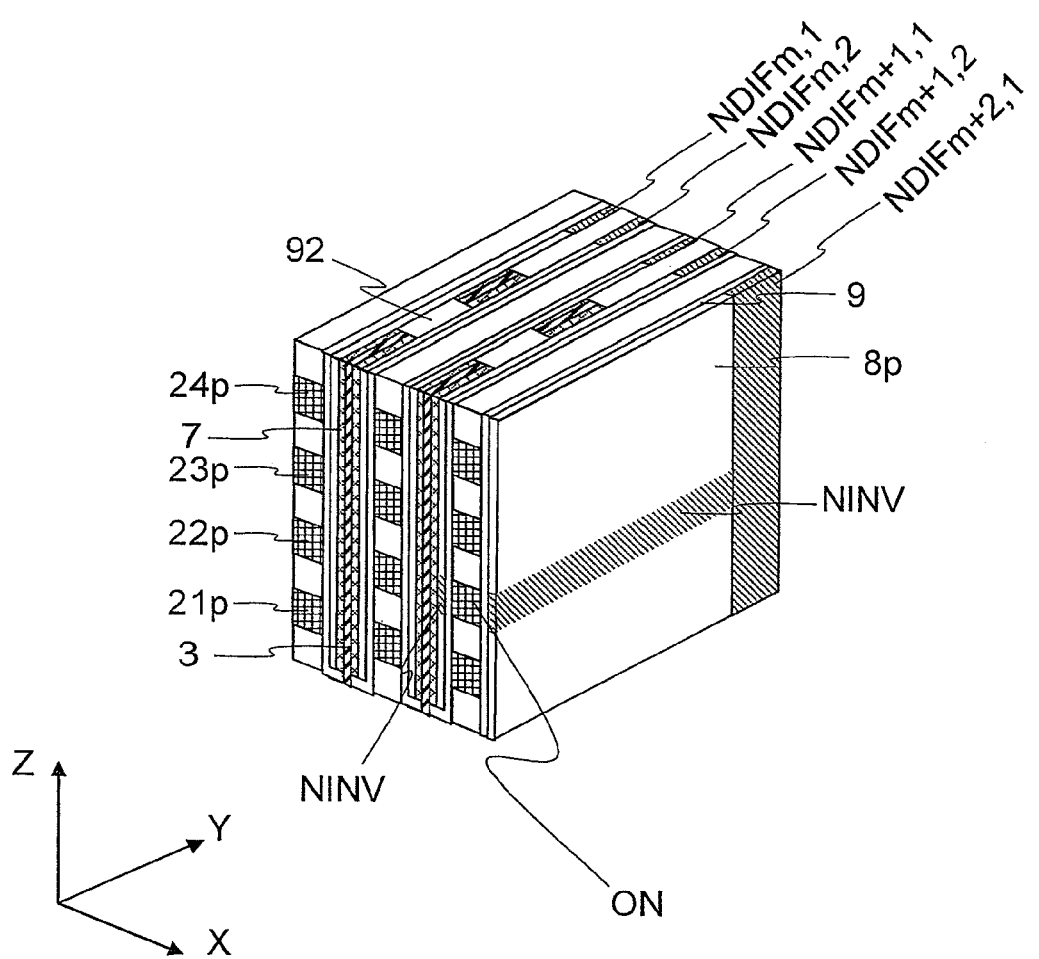
FIG. 12 is a perspective view illustrating an edge of the memory cell array shown in FIGS. 10, 11.

FIG. 12 is a perspective view illustrating an edge portion of the memory cell array shown in FIGS. 10, 11. At the edge portion of the memory cell array in FIGS. 10, 11, a N-type diffusion layer is formed in the channel semiconductor layer 8p as shown in FIG. 12. Although not shown in FIG. 12, the N-type diffusion layer is configured so that an electric power can be supplied to it from peripheral circuits through a contact and a wire. For example, a N-type inverted layer NINV is formed as shown in FIG. 12 in the channel semiconductor layer 8p by applying an ON voltage to the gate electrode 22p. Memory cells in the memory array are electrically connected with the diffusion layer at the edge portion of the array through NINV.

Figure 13:
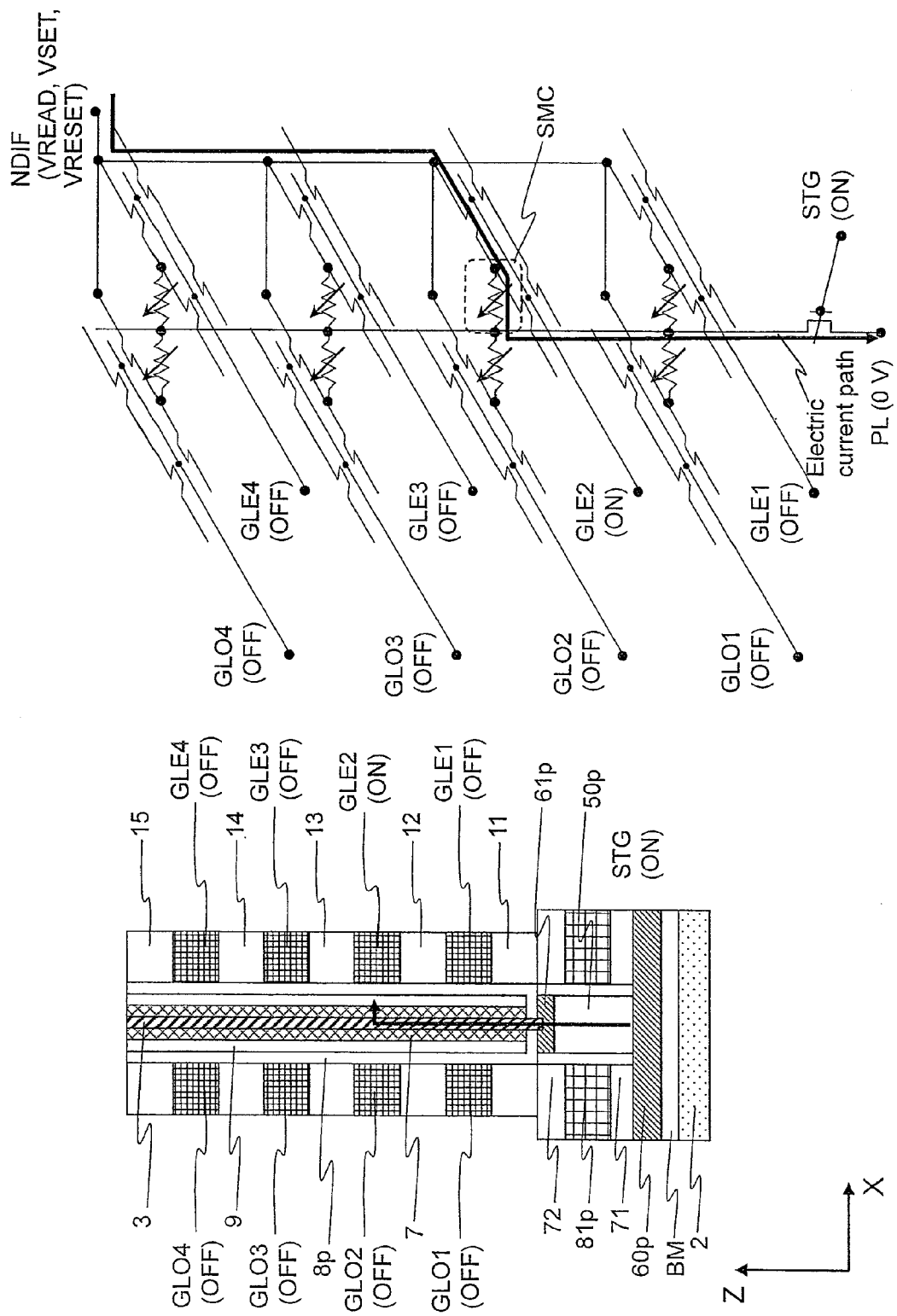
FIG. 13 shows an electric voltage condition that allows a selected cell SMC to operate in the configuration example shown in FIG. 10.

FIG. 13 illustrates electric voltage conditions for operating the selected cell SMC in the configuration example shown in FIG. 10. An electric voltage is applied to the gate electrode 22p (GLE2) to invert the channel semiconductor layer 8p, so that the inverted layer NINV that electrically connects the SMC with the diffusion layer at the edge portion of the array shown in FIG. 12 is formed in the channel semiconductor layer 8p.

An ON voltage is applied to the gate 81p of the selection transistor STG with which the SMC is connected, so that the plate electrode and the bit line 3 are set into a conductive state. The SMC can be operated by: setting the plate electrode PL into 0V; applying an electric voltage to the N-type diffusion layer; and applying, to the inverted layer NINV, electric voltages VREAD, VSET, VRESET corresponding to a read operation, a set operation, a reset operation.

Figure 14:
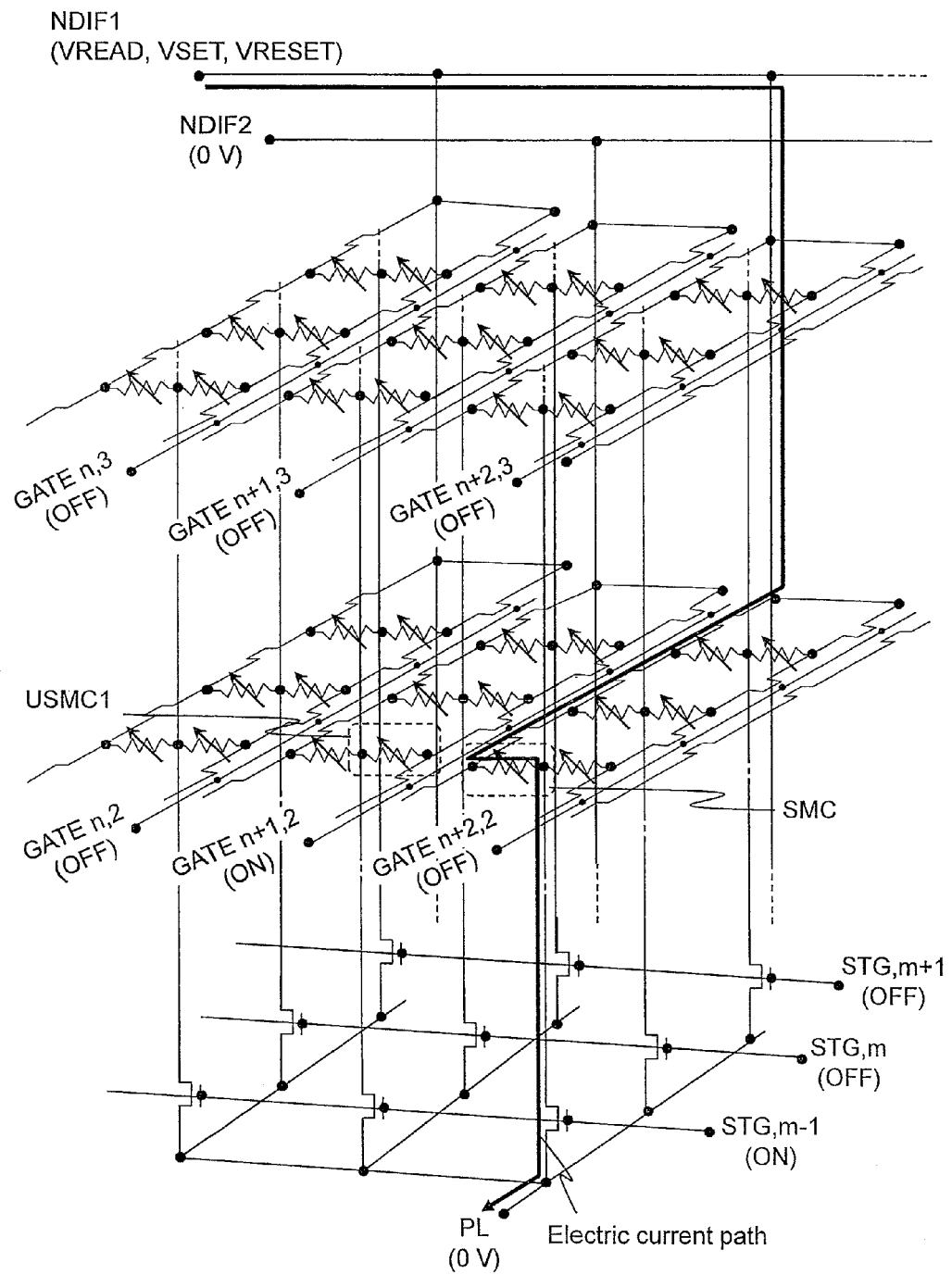
FIG. 14 is a diagram explaining a select operation of a memory array in which the equivalent circuits shown in FIG. 13 are aligned in a X direction and a Y direction.

FIG. 14 is a diagram explaining a select operation of a memory array in which the equivalent circuit shown in FIG. 13 is aligned in a X direction and in a Y direction. An OFF voltage is applied to the cell gate electrodes 21p to 24p with which the selected cell SMC doesn't contact. For selection transistors that are not contacted with bit lines 3 with which the selected cell SMC contacts, the OFF voltage is applied to the gate electrode 81p. As such, a memory cell contacting with the channel semiconductor 8p in which both of the selection transistor extended in the X direction and the cell transistor extended in the Y direction are set into an ON state can be selected. In order to prevent from duplicated selection, the cell gate electrodes 21p to 24p are configured so that independent electric potential can be supplied to each of them, and the electric potential of the diffusion layer NDIF is separated at both sides of the cell gate electrodes 21p to 24p. FIG. 14 shows the configuration as NDIF1, NDIF2.

In FIG. 14, when performing the read, set, and reset operations, 0V is applied to NDIF2 and PL, and VREAD, VSET, VRESET are applied to NDIF1. The ON voltage is applied only to GATEn+1, 2 among a plurality of stacked gate electrode wires, thus the inverted layer NINV is formed only at both sides of GATEn+2, 2. On the other hand, the ON voltage is applied only to the selection transistor STG, m−1 at the PL side. Accordingly, throughout the memory array, electrodes at both sides of memory cell only in SMC and USMC1 are connected with external components. SMC is provided with an electric potential difference corresponding to the read, set, and reset operations between NDIF1 and PL so as to operate. USMC1 is provided with no electric potential difference between NDIF2 and PL so as not to operate. Accordingly, only SMC can be selectively operated.

Figure 15:
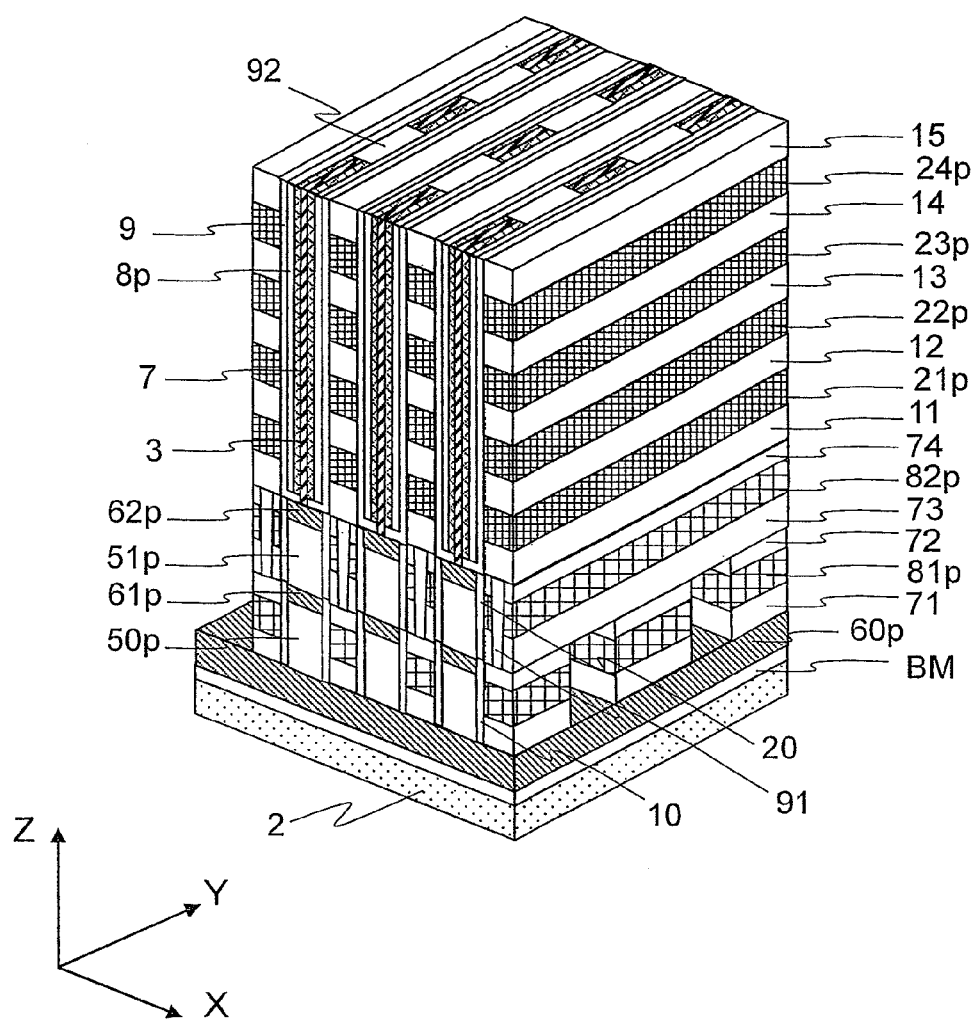
FIG. 15 is a diagram illustrating a configuration example in which cell gate electrodes 21p to 24p are connected.

FIG. 15 is a diagram illustrating a configuration example in which the cell gate electrodes 21p to 24p are connected. In FIG. 15, the cell gate electrodes 21p to 24p are connected in each layer. Namely, each of the electrodes 21p, each of the electrodes 22p, each of the electrodes 23p, and each of the electrodes 24p are connected respectively. The NDIF with which the channel semiconductor layer 8p is coupled is connected by spaces of the gate electrodes 21p to 24p adjacent to each other in the X direction. The configuration shown in FIG. 15 additionally includes, compared with the configuration shown in FIG. 10, a second selection transistor comprising a gate polysilicon layer 82p, a gate insulating film 20, and a channel polysilicon layer 51p. The operation of the second selection transistor will be described later.

FIG. 16 is a cross-sectional diagram of FIG. 15. FIG. 16(a) is a X-Z cross-sectional diagram and FIG. 16(b) is a Y-Z cross sectional diagram. As shown in FIG. 16 (a) (b), the gate polysilicon 82p of the second selection transistor is extended in the Y direction. A hole is formed inside the gate polysilicon 82p. The gate insulating film 20 and the channel polysilicon 51p are filled inside the hole. The second selection transistor intersects with a first transistor comprising a gate polysilicon 81p extended in the X direction, a gate insulating film 10, and a channel polysilicon 50p. These selection transistors are necessary for implementing a select operation under the configuration in which the cell gate electrodes 21p to 24p are connected with each other and the electric potentials of the channel semiconductor layers 8p are set into the same potential.

Figure 17:
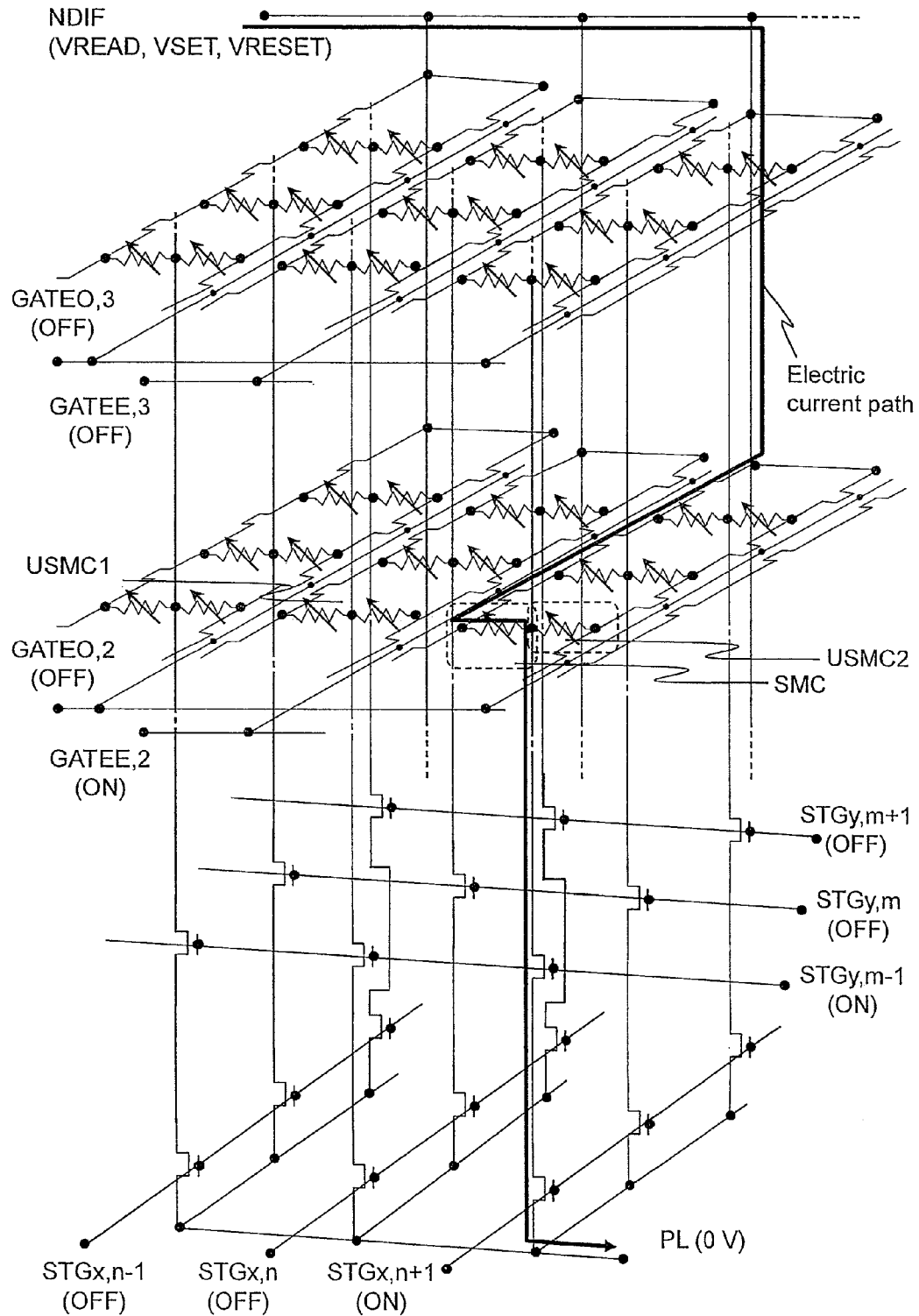
FIG. 17 is an equivalent circuit diagram of the configuration example shown in FIG. 15.

FIG. 17 is an equivalent circuit diagram of the configuration example shown in FIG. 15. In FIG. 17, only one location of the intersection of the first selection transistor (STGx,n+1 in FIG. 17) in ON state and the second selection transistor (STGy,m−1 in FIG. 17) in ON state, namely only one bit line including SMC, USMC2, and the like, is connected with the plate electrode PL by setting one of the first selection transistors (STGx,n+1, STGx,n, STGx,n+1) and one of the second selection transistors (STGy,m−1, STGy,m, STGy,m+1) into ON state. Other bit lines are insulated from the plate electrode PL because both of or any one of the first selection transistor and the second selection transistor are in OFF state.

Every alternate cell gate electrodes 21p to 24p are connected in each of layers. For example, the gate in the second layer connects GATEO,2 with GATEE,2, and the gate in the third layer connects GATEO,3 with GATEE,3. By the first and second selection transistors, an electric current flows only through the selected cell SMC to operate it, even under the configuration in which the diffusion layer for supplying an electric power to the channel semiconductor layer 8p adjacent to each other in the X direction is connected.

For example, an ON voltage is applied only to GATEE,2 among cell gate electrodes and an OFF voltage is applied to other cell gate electrodes in FIG. 17. Under such a state, both sides of the memory cell are conductive to external components only in the selected cell SMC. In other words, only the selected cell SMC can be selectively operated by an electric voltage applied to NDIF.

According to the configurations in FIGS. 15 to 17, number of components in peripheral circuits of the memory cell array, such as electric contacts or electric voltage applying circuits, can be reduced to suppress the are size of components and to increase integration density by connecting every alternate cell gate electrodes 21p to 24p.

First Embodiment: Summary

As discussed above, the semiconductor memory device according to the first embodiment includes the bit line 3 and the variable resistance material layer 7 oriented to different directions from each other. Thus lengths of them can be adjusted individually. Therefore, it is not necessary to raise electric voltages applied to both ends of the variable resistance elements when performing read/rewrite operations even if the channel length of the sell transistors is lengthen to improve the source/drain breakdown voltage. Accordingly, the memory cell structure can be stacked three dimensionally to densify it with above-mentioned formulas (1) to (3) being satisfied, which is advantageous for decreasing bit costs.

Second Embodiment

In the semiconductor memory device explained in the first embodiment, there is a technical problem of a trade-OFF between electric power consumption in rewrite operations and read out performance. If rewrite electric currents in the variable resistance material are reduced and the memory cell is further miniaturized to reduce set electric currents and reset electric currents for achieving low electric power consumption, the electric current allowed to flow through the memory cell in the read operation will be decreased. This is because only an electric current smaller than set electric currents and reset electric currents is allowed to flow so as not to destroy data in the read operation. If the read electric current is small, a sensing amp requires longer time to detect the resistance value of the memory cell, which decreases the read out performance. The effect of low performance is large specifically in read operations such as fast access or random access.

Then in the second embodiment of the present invention, a memory cell structure will be described in which rewrite operations with low electric currents and fast read operations are both achieved. Other configurations of the semiconductor memory device are same as those of the embodiment 1, thus omitted.

The technical problem of decreased read electric current along with decreasing rewrite electric current can be improved by using a resistive memory employing the channel semiconductor layer 8p as an electrode. An electric charge of the channel semiconductor layer 8p can be controlled by an electric voltage of the cell gate electrode, and electrons and holes can be switched. The junction characteristics between the variable resistance material layer 7 and the channel semiconductor layer 8p can be also controlled by a cell gate voltage. A fast read operation using a large electric current is achieved by performing the read operation under a junction state with low resistance. Set and reset operations with low electric current and low electric power consumption can be achieved by performing the set and reset operations under a junction state with high resistance to concentrate the incident energy onto the selected cell.

Preferred electric voltage conditions for read operation, set and reset operations depend on the conductive type of the variable resistance material and on the conductive type of the diffusion layer formed in the channel semiconductor layer. Thus hereinafter descriptions will be provided individually for each of those cases.

Figure 18:
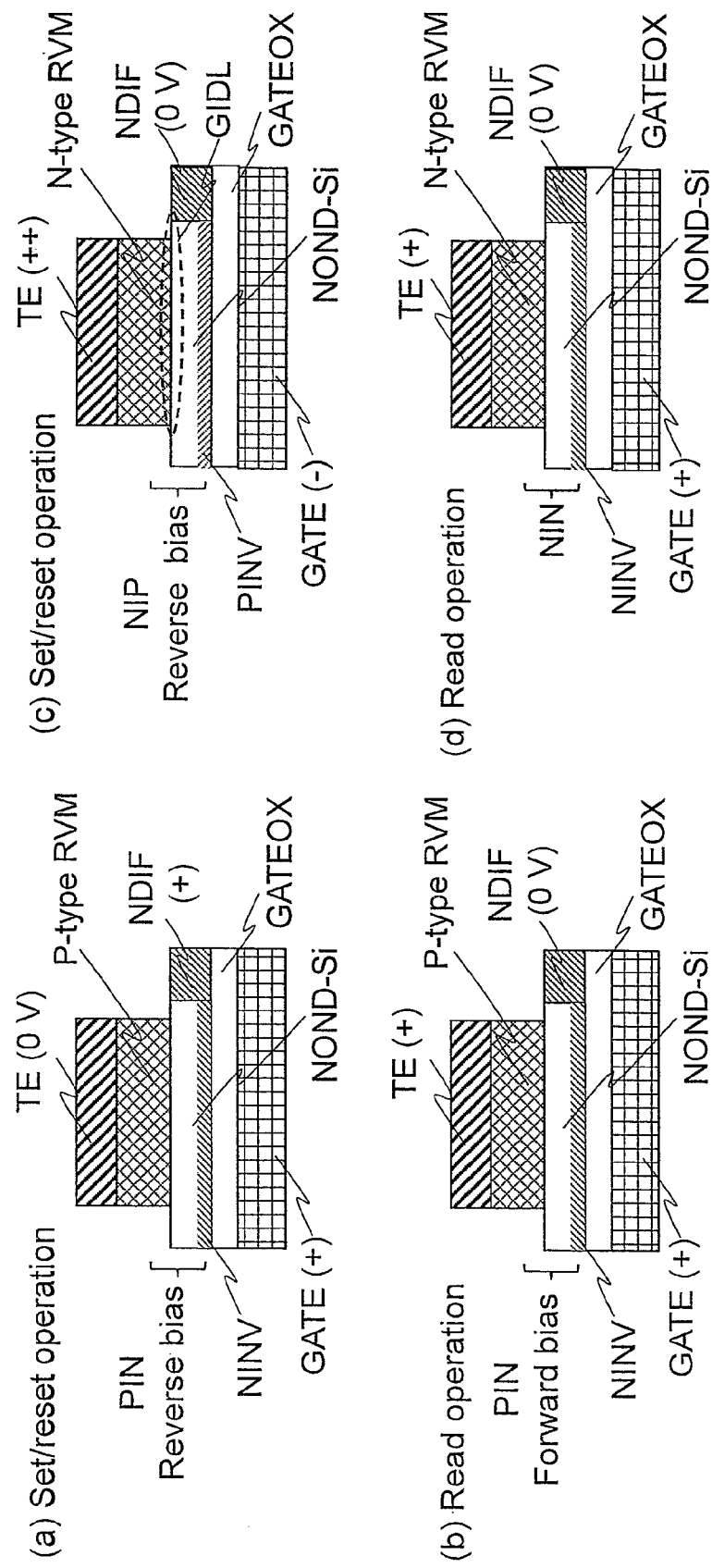
FIG. 18 is a diagram explaining set/reset operations and a read operation where conductive type of a diffusion layer is N-type.

FIG. 18 is a diagram explaining a set/reset operations and a read operation in a case where the conductive type of the diffusion layer is N-type. FIG. 18 (a) (b) illustrate operations in a case where the conductive type of the variable resistance material is P-type. FIG. 18 (c) (d) illustrate operations in a case where the conductive type of the variable resistance material is N-type (N-type RVM). NOND-Si is a non-doped silicon and GATEOX is a gate insulating film.

In FIG. 18 (a) (b), a gate side of the channel semiconductor layer can be inverted into N-type by applying a positive voltage to the gate with the electric potential of 0V in the diffusion layer. Accordingly, the junction between the variable resistance material and the N-type inverted layer is a PIN junction. If set and reset operations are performed by applying a reverse bias to the PIN junction as shown in FIG. 18(a), namely by applying a positive voltage on the side of N-type inverted layer to the upper electrode TE on the side of P-type variable resistance material, the resistance of the memory cell portion is higher compared with a case where a forward bias is applied as shown in FIG. 18(b), namely a case where a positive voltage is applied on the side of the N-type inverted layer to TE on the side of the P-type variable resistance material. Thus energy can be provided to the memory cell required for set and reset operations with smaller electric currents. Accordingly, the reverse bias condition shown in FIG. 18(a) is preferred for set and reset operations.

In the forward bias condition of FIG. 18(b), the information in the memory cell is not rewritten even if an electric current flows larger than that of the reverse bias condition in FIG. 18(a). Therefore, non-destructive read operation can be performed with an electric current larger than that of FIG. 18(a) by using the forward bias condition in FIG. 18(b) for the read operation. Accordingly, the forward bias condition such as FIG. 18(b) is preferred for the read operation.

Although 0V is applied to the upper electrode TE and a positive voltage is applied to the N-type diffusion layer in FIG. 18(a), the required condition is to satisfy:

$$\text{the electric potential of the upper electrode TE} < \text{the electric potential of the N-type diffusion layer} \quad (4)$$

$$\text{the electric potential of the upper electrode TE} < \text{the electric potential of the gate} \quad (5)$$

Accordingly, the same effect can be achieved by applying 0V to the N-type diffusion layer and applying a negative voltage to the upper electrode. It is the same in below.

In FIG. 18 (c) (d), since the conductive type of the diffusion layer is N-type, if a negative voltage is applied to the gate and a positive voltage is applied to the upper electrode TE at the side of the N-type variable resistance material, a so-called Gate-Induced Drain Leakage (GIDL) occurs between the N-type variable resistance material/the channel semiconductor layer. The channel semiconductor layer is filled with P-type carriers. At this time, the junction between the variable resistance material and the channel semiconductor layer is a NIP junction. As 0V is applied to the N-type diffusion layer, an electric voltage is applied to the NIP junction in the reverse bias direction and an electric current flows. On the other hand, the gate side of the channel semiconductor layer can be inverted into N-type by applying a positive voltage to the gate with the electric potential of 0V in the diffusion layer as shown in FIG. 18(d). The junction between the N-type variable resistance material and the N-type inverted layer is a NIN junction. Providing an electric potential difference between the N-type variable resistance material and the N-type inverted layer to the NIN junction as shown in FIG. 18(d) allows an electric current to flow.

In the condition of FIG. 18(c), an electric current flows under the reverse bias condition toward the junction between the variable resistance material and the channel semiconductor layer. Thus the energy can be concentrated on the variable resistance materials. On the other hand, in the condition of FIG. 18(d), the junction is a NIN junction and thus the resistance of the junction is low, which allows keeping the resistance state of the variable resistance material even if larger electric currents flow. Accordingly, the condition in FIG. 18(c) is suitable for set and reset operations, and the condition in FIG. 18(d) is suitable for the read operation.

Figure 19:
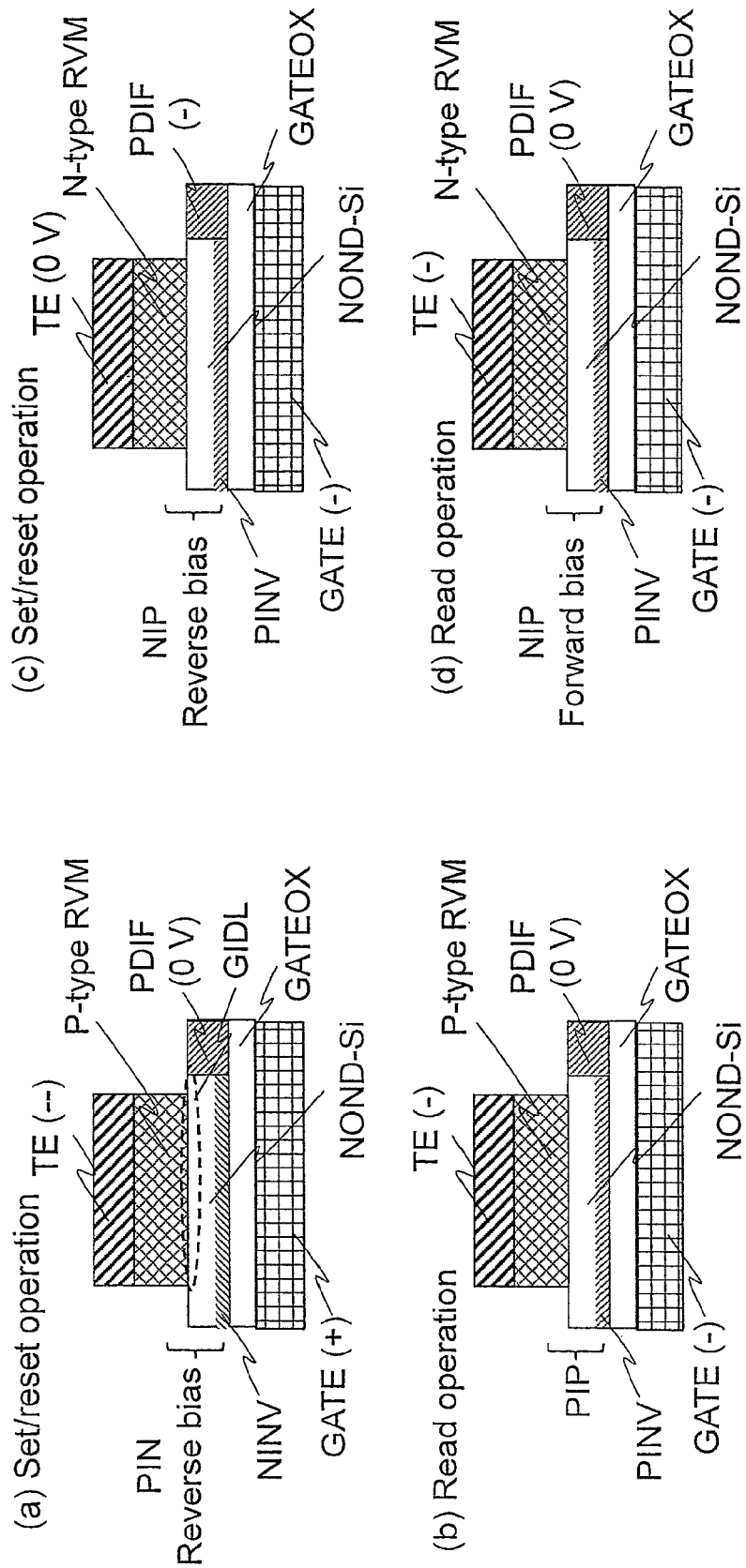
FIG. 19 is a diagram explaining set/reset operations and a read operation where conductive type of a diffusion layer is P-type.

FIG. 19 is a diagram explaining a set/reset operations and a read operation in a case where the conductive type of the diffusion layer is P-type. FIG. 19 (a) (b) illustrate operations in a case where the conductive type of the variable resistance material is P-type. FIG. 19 (c) (d) illustrate operations in a case where the conductive type of the variable resistance material is N-type.

In FIG. 19 (a) (b), since the conductive type of the diffusion layer is P-type, if a positive voltage is applied to the gate and a negative voltage is applied to the upper electrode TE at the side of the P-type variable resistance material, a so-called Gate-Induced Drain Leakage (GIDL) occurs between the P-type variable resistance material/the channel semiconductor layer. The channel semiconductor layer is filled with N-type carriers. At this time, the junction between the variable resistance material and the channel semiconductor layer is a PIP junction. As 0V is applied to the P-type diffusion layer, an electric voltage is applied to the PIP junction in the reverse bias direction and an electric current flows. On the other hand, the gate side of the channel semiconductor layer can be inverted into P-type by applying a negative voltage to the gate with the electric potential of 0V in the diffusion layer as shown in FIG. 19(b). The junction between the P-type variable resistance material and the P-type inverted layer is a PIP junction. Providing an electric potential difference between the P-type variable resistance material and the P-type inverted layer to the PIP junction as shown in FIG. 19(b) allows an electric current to flow.

In the condition of FIG. 19(a), an electric current flows under the reverse bias condition toward the junction between the variable resistance material and the channel semiconductor layer. Thus the energy can be concentrated on the variable resistance materials. On the other hand, in the condition of FIG. 19(b), the junction is a PIP junction and thus the resistance of the junction is low, which allows keeping the resistance state of the variable resistance material even if larger electric currents flow. Accordingly, the condition in FIG. 19(a) is suitable for set and reset operations, and the condition in FIG. 19(b) is suitable for the read operation.

In FIG. 19 (c) (d), a gate side of the channel semiconductor layer can be inverted into P-type by applying a negative voltage to the gate with the electric potential of 0V in the diffusion layer. Accordingly, the junction between the variable resistance material and the P-type inverted layer is a NIP junction. If set and reset operations are performed by applying a reverse bias to the NIP junction as shown in FIG. 19(c), namely by applying a negative voltage on the side of P-type inverted layer to the upper electrode TE on the side of N-type variable resistance material, the resistance of the memory cell portion is higher compared with a case where a forward bias is applied as shown in FIG. 19(d), namely a case where a negative voltage is applied on the side of the P-type inverted layer to TE on the side of the P-type variable resistance material. Thus energy can be provided to the memory cell required for set and reset operations with smaller electric currents. Accordingly, the reverse bias condition shown in FIG. 19(c) is preferred for set and reset operations.

In the forward bias condition of FIG. 19(d), the information in the memory cell is not rewritten even if an electric current flows larger than that of the reverse bias condition in FIG. 19(c). Therefore, non-destructive read operation can be performed with an electric current larger than that of FIG. 19(c) by using the forward bias condition in FIG. 19(d) for the read operation. Accordingly, the forward bias condition such as FIG. 19(d) is preferred for the read operation.

Figure 20:
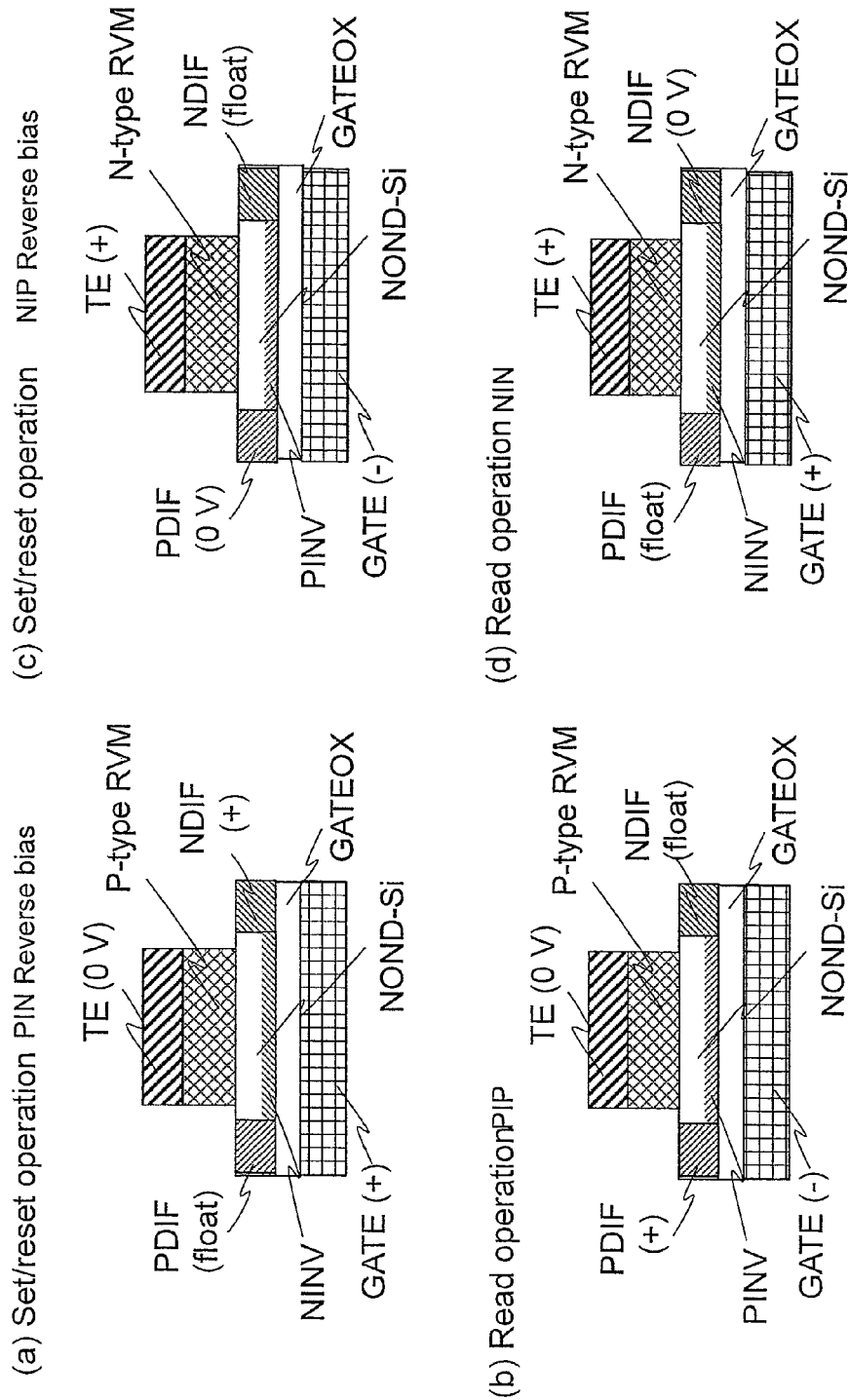
FIG. 20 is a diagram explaining set/reset operations and a read operation where both of P-type diffusion layer and N-type diffusion layer are formed in a channel semiconductor layer.

FIG. 20 is a diagram illustrating set/reset operations and a read operation in a case where both of P-type and N-type diffusion layers are formed in the channel semiconductor layer. FIG. 20 (a) (b) show operations in the case where the conductive type of the variable resistance material is P-type. FIG. 20 (c) (d) show operations in the case where the conductive type of the variable resistance material is N-type.

In FIG. 20 (a) (b), when performing set and reset operations, the P-type diffusion layer is set into a floating state and a positive voltage is applied to the gate to form a N-type inverted layer at the gate side of the channel semiconductor layer, as shown in FIG. 20(a). In this state, if a reverse bias is applied to the PIP junction formed between the P-type variable resistance material/the N-type inverted layer to allow an electric current to flow, the energy is concentrated on the junction, which enables set and reset operations with low electric currents. When performing read operations, the N-type diffusion layer is set into a floating state and a negative voltage is applied to the gate to form a P-type inverted layer at the gate side of the channel semiconductor layer, as shown in FIG. 20(b). In this state, if an electric potential difference is provided to the PIP junction formed between the P-type variable resistance material/the P-type inverted layer to allow an electric current to flow, a larger electric current can flow with the state of the variable resistance material being kept because the resistance of the junction is lower than that of FIG. 20(a). Accordingly, a fast read operation using larger electric currents can be achieved.

In FIG. 20 (c) (d), when performing set and reset operations, the N-type diffusion layer is set into a floating state and a negative voltage is applied to the gate to form a P-type inverted layer at the gate side of the channel semiconductor layer, as shown in FIG. 20(c). In this state, if a reverse bias is applied to the NIP junction formed between the N-type variable resistance material/the P-type inverted layer to allow an electric current to flow, the energy is concentrated on the junction, which enables set and reset operations with low electric currents. When performing read operations, the P-type diffusion layer is set into a floating state and a negative voltage is applied to the gate to form a N-type inverted layer at the gate side of the channel semiconductor layer, as shown in FIG. 20(d). In this state, if an electric potential difference is provided to the NIN junction formed between the N-type variable resistance material/the N-type inverted layer to allow an electric current to flow, a larger electric current can flow with the state of the variable resistance material being kept because the resistance of the junction is lower than that of FIG. 20(c). Accordingly, a fast read operation using larger electric currents can be achieved.

Second Embodiment: Summary

As discussed above, the semiconductor memory device according to the second embodiment inverts polarities of voltages applied to the memory cell between read operations and rewrite operations, depending on the conductive type of the diffusion layer and the conductive type of the variable resistance material. Therefore, both of rewrite operations with low electric current and fast read operations can be achieved utilizing the resistance at the junction between the variable resistance material and the channel semiconductor layer.

Third Embodiment

In order to achieve the effects in the second embodiment, it is necessary to connect the channel semiconductor layer controlled by the cell gate with the variable resistance material. However, it is not necessary to dispose the cell gate and the variable resistance material at the both sides sandwiching the channel semiconductor layer. In a third embodiment of the present invention, another structural example will be described that is different from the second embodiment for each of these layers.

FIG. 21 is a diagram illustrating another structural example exhibiting effects similar to those of the second embodiment. FIG. 21(a) is a perspective view, and FIG. 21(b) is a YZ cross-sectional diagram. In FIG. 21, a hole is formed that penetrates inside of a gate polysilicon layer 1p extended in a Y direction and inside of insulating films 71, 72 formed above and below the gate polysilicon layer 1p. A gate insulating film 9 and a channel semiconductor layer 8p are formed inside the hole. The bottom portion of the channel semiconductor layer 8p contacts with a N-type polysilicon layer 60p.

In the example of FIG. 21, the altitude of the upper surface of the channel semiconductor layer 8p is lower than the altitude of the upper surface of the insulating layer 71 on the gate polysilicon layer 1p. The variable resistance material layer 7 is formed on the channel semiconductor layer 8p.

Read, set, and reset operations can be performed by: applying 0V to a plate electrode 2; applying an ON voltage to the cell gate of the selected cell; and applying VREAD, VSET, VRESET to the bit line of the selected cell respectively. In a case where a P-type material is used for the variable resistance material layer 7, set and reset operations are performed with the electric voltage condition of FIG. 18 (a) and read operations are performed with the electric voltage condition of FIG. 18(b), thereby achieving both of rewrite operations with low electric current and low electric power consumption and fast read operations using large electric currents.

As FIGS. 18 to 20 in the second embodiment, both of P-type and N-type can be used for the variable resistance material layer 7. Although the diffusion layer 60p is N-type in FIG. 21, P-type can be used. In addition, the bottom portion of the channel semiconductor layer 8p in FIG. 21 can be formed so that it contacts with both of P-type and N-type diffusion layers.

Fourth Embodiment

In the first to third embodiments, one of two electrodes of the resistive memory is a channel semiconductor layer controlled by a cell gate and another one is a metal electrode. On the other hand, as a technique for densifying the memory cell to promote low costs by using the channel semiconductor layer as an electrode, it can be contemplated to use the channel semiconductor layer as both of the electrodes of the resistive memory.

Figure 22:
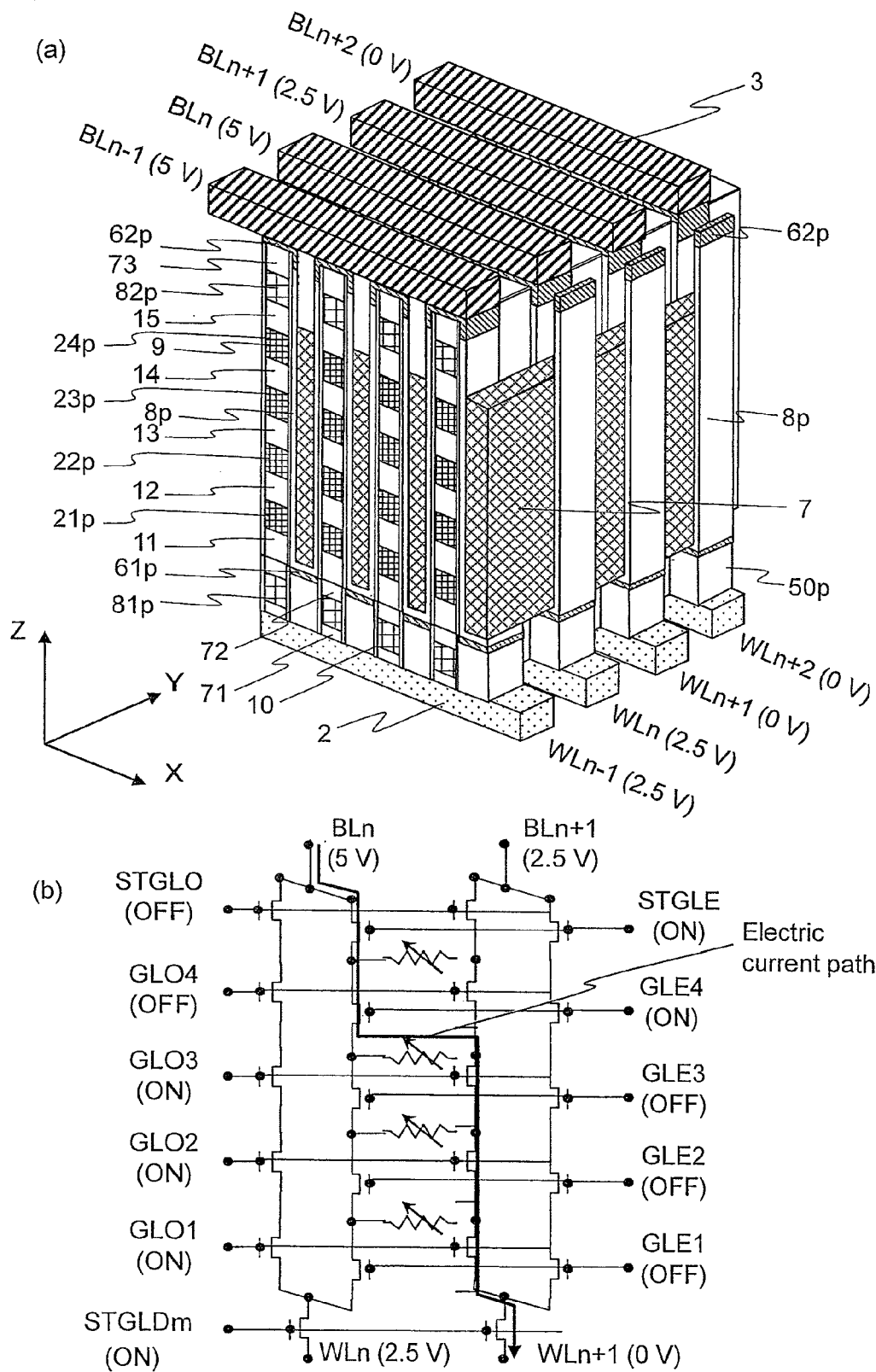
FIG. 22 is a diagram illustrating a configuration of a memory cell array portion of a semiconductor memory device according to a fourth embodiment.

FIG. 22 is a diagram illustrating a configuration of a memory cell array portion of a semiconductor memory device according to a fourth embodiment of the present invention. In the configuration example shown in FIG. 22, information is rewritten by a resistance change in the variable resistance material layer 7 formed between channel semiconductor layers 8p.

FIG. 22(a) is a schematic cross-sectional diagram illustrating a portion of the semiconductor memory device according to the fourth embodiment. In FIG. 22(a), a lower electrode wire (word line) 2 extended in a X direction, a gate polysilicon layer 81p forming a selection transistor, insulating films 71 and 72, a gate insulating film 10, a channel polysilicon layer 50, cell gate polysilicon layers 21p to 24p forming a stack extended in a Y direction, insulating films 11 to 15, a selection transistor gate polysilicon layer 82p, an insulating film 73, a gate insulating film 9 of the cell transistor, a channel semiconductor layer 8p, N-type diffusion layers 61p and 62p, a bit line 3 extended in the X direction, a stack comprising the cell gate polysilicon layers 21p to 24p adjacent to each other in the X direction/the insulating films 11 to 14/the selection transistor gate 82p/the insulating film 73, and a variable resistance material layer 7 filled along the Y-Z plane at the boundary portion between the stacks, are shown.

The upper surface of the variable resistance material layer 7 is below the upper surface of the selection transistor gate 82p. A plurality of the word line 2 and the bit line 3 are aligned in the Y direction. Independent electric potentials can be provided to those lines. The channel semiconductor layer 8p is formed so that it extends in a Z direction along the stack only at the region sandwiched between the word line 2 and the bit line 3. The upper portion of the channel semiconductor layer 8p is connected with the bit line 3 through the N-type polysilicon layer 62p. The lower portion of the channel semiconductor layer 8p is connected with the channel semiconductor layer 50p through the N-type polysilicon layer 61p. The variable resistance material layer 7 is connected with each of the channel semiconductor layers 8p, thus the channel semiconductor layers 8p adjacent to each other in the Y direction are connected with each other through the variable resistance material layer 7.

In the semiconductor memory device according to the fourth embodiment, it is important that the channel semiconductor layers 8p adjacent to each other in the Y direction are connected with each other through the variable resistance material layer 7. As long as formed as such, the variable resistance material layer 7 is not required to be formed in a planar form in the Y-Z plane.

When performing a set operation, 5V is applied to the n-th bit line and 0V is applied to the n+1-th word line. On the basis of the electric potential difference, information is stored by allowing an electric current to flow between the channel semiconductor layers 8p adjacent to each other in the Y direction through the variable resistance material layer 7. The location of the electric current in the Z direction flowing through the channel semiconductor layers 8p can be controlled by the cell gate electrodes 21p to 24p.

FIG. 22(b) is an equivalent circuit of FIG. 22(a). Two of the channel semiconductor layers 8p sandwiched between the stacks are formed as pairs opposing to each other in the X direction and are aligned adjacent to each other in the Y direction. The two channel semiconductor layers 8p forming a pair are controlled by individual cell gate electrodes respectively. It is the same for the selection transistor gate 82p. An On voltage is applied to one of two selection transistor gates and an OFF voltage is applied to another one.

In FIG. 22(b), the channel semiconductor layer 8p at the STGLE side is set into a state conductive to the bit line 3. An ON voltage is applied to the cell gate in the fourth layer on the same side as STGLE. An OFF voltage is applied to the first to third layers. In contrast, the ON voltage is applied to the cell gate in the first to third layers on the STGLO side, and the OFF voltage is applied to the fourth layer. As a result, at the altitude between the third and the fourth layers, an electric current flows from the STGLE side of the n-th channel semiconductor layer 8p to the STGLO side of the n+1-th channel semiconductor layer 8p. It changes the resistance value of the variable resistance material layer 7 at this portion.

Figure 23:
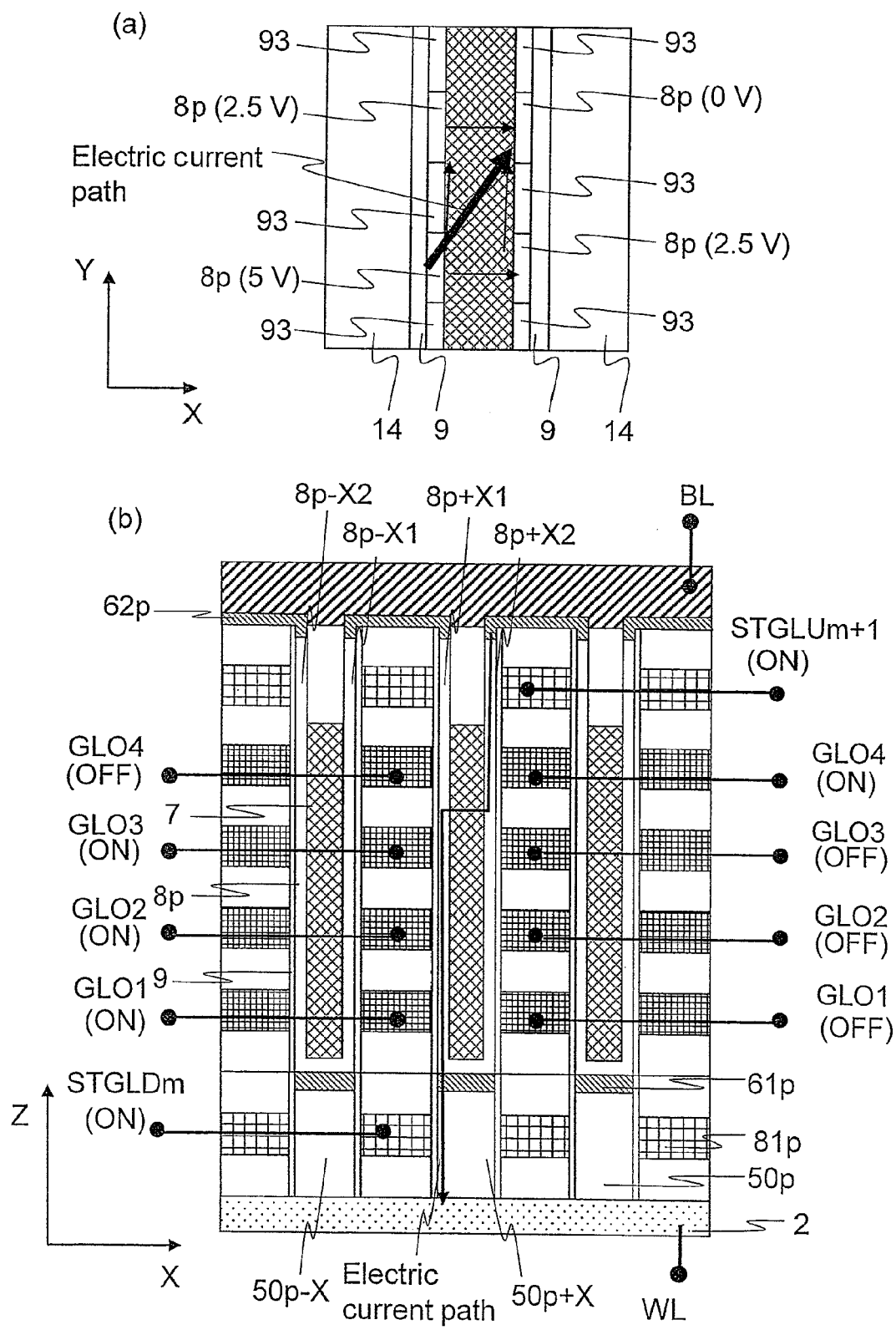
FIG. 23 is a diagram explaining an electric current path when an electric current flows in a variable resistance material layer 7 in FIG. 22(b).

FIG. 23 is a diagram explaining an electric current path when an electric current flows through the variable resistance material layer 7 in FIG. 22(b). FIG. 23(a) is a XY cross-sectional diagram. FIG. 23(b) is a XZ cross-sectional diagram.

In FIG. 23(a), since there is an electric potential difference between four channel semiconductor layers 8p, namely between the two n-th channel semiconductor layers 8p and the two n+1-th channel semiconductor layers 8p, an electric current flows between each of them. The maximum electric current flows in the path where the electric potential difference is maximum (5V), thereby achieving an operation of the cell. The selection transistor using the gate polysilicon 81p formed on the word line 2 as a gate is used for selecting in the X direction of the memory cell array. An ON voltage is applied to the gate GLO at the STGLO side where an OFF voltage is applied to the upper selection transistor, and the OFF voltage is applied to the gate GLE on the STGLE side where the ON voltage is applied to the upper selection transistor.

As shown in FIG. 23(b), the electric current path from the bit line 3 to the word line 2 can be limited to a single portion of the selected cell by shifting the location where the ON voltage is applied to the upper and lower selection transistors by one layer in the X direction. It is assumed that the OFF voltage is applied to the selection transistors other than the selection transistors to which the ON state is designated.

The reason why the memory can be selected in the X direction is as follows. When applying an ON voltage to the lower selection transistor gate STGLm, the channel semiconductor layers at both sides of 50p+X and 50p−X are set into the ON state. However, at the 50p−X side, 8p−X1 and 8p−X2 are set into the OFF state by the upper selection transistors. Thus the bit line 3 and the word line 2 will not be conductive. On the other hand, at the 50p+X side, 8p+X1 is set into the OFF state by the upper selection transistor. However, 8p+X2 is set into the ON state by the upper selection transistor. Thus the bit line 3 and the word line will be conductive.

Fourth Embodiment: Summary

As discussed above, the semiconductor memory device according to the fourth embodiment includes the channel semiconductor layer and the variable resistance material layer each extended into different directions, as in the first to third embodiments. Accordingly, the device can be densified by three dimensional lamination as in the first to third embodiments, which is beneficial for low bit costs.

DESCRIPTION OF SYMBOLS 2,3 electrode wire (word line, bit line)
1p, 21p, 22p, 23p, 24p, 81p, 82p gate polysilicon layer
7 variable resistance material layer
8p, 8p−X1, 8p−X2, 8p+X1, 8p+X2 channel semiconductor layer
9, 10 gate insulating film
50p, 51p, 50p−X, 50p+X channel semiconductor layer
60p, 61p, 62p N-type polysilicon layer
11, 12, 13, 14, 15, 71, 72, 73, 74 insulating film
31, 32, 90, 91, 92, 93 insulating film
BM barrier metal
GATE, GATE1, GATE2, GATE3 gate electrode
GATE n−1,3, GATE n,3, GATE n−1,3 gate electrode
GATE n−1,2, GATE n,2, GATE n+1,2 gate electrode
GATEO,2, GATEE, 2, GATEO, 3, GATEE, 3 gate electrode
STG gate electrode of selection transistor
STGn, STGn+1 selection transistor gate
STG,m−1, STG, m, STG,m+1 selection transistor gate
STGx,n−1, STGx,n, STGx,n+1 selection transistor gate
STGy,m−1, STGy, m, STGy,m+1 selection transistor gate
BL, BL1, BL2, BL3, BLn−1, BLn, BLn+1, BLn+2 bit line
BLE1, BLE2, BLE3, BLE4 bit line
BLO1, BLO2, BLO3, BLO4 bit line
PL plate electrode
SMC selected cell
USMC1, USMC2 non-selected cell
CELLA, CELLB memory cell
NDIF, NDIF1, NDIF2, NDIFm,1, NDIFm,2, NDIFm+1,1, NDIFm+1,2 N-type diffusion layer
PDIF P-type diffusion layer
NINV N-type inverted layer
PINV P-type inverted layer
NOND-Si non-dope silicon
TE upper electrode
WLn−1, WLn, WLn+1, WLn+2 word line

What is claimed is:

1. A semiconductor memory device, comprising:
   a cell gate electrode;
   a gate insulating film formed in a surface of the cell gate electrode;
   a channel semiconductor layer formed on the cell gate electrode through the gate insulating film;
   a first diffusion layer connected with the channel semiconductor layer;
   a variable resistance material layer electrically connected to, and in direct contact with, the channel semiconductor layer at a portion in the channel semiconductor layer where the gate insulating film is not formed on a surface;
   a metal wire electrically connected to, and in direct contact with, the variable resistance material layer; and
   a metal wire layer supplying an electric power to the first diffusion layer, the cell gate electrode, and the metal wire,
   wherein the variable resistance material layer and the channel semiconductor layer are connected in series between the first diffusion layer and the metal wire.

2. The semiconductor memory device according to claim 1, wherein:
   the cell gate electrode is extended in a direction vertical to a substrate surface, a plurality of the cell gate electrode is disposed in a first direction parallel to the substrate surface, and a plurality of the cell gate electrode is disposed in a second direction perpendicular to the first direction and parallel to the substrate surface;
   the channel semiconductor layer is extended in a direction vertical to the substrate surface along the cell gate electrode, and the channel semiconductor layer is connected with the cell gate electrode through the gate insulating film;
   the metal wire is extended in the second direction and multiple layers of the metal wire are stacked, through insulating films, in a direction vertical to the substrate surface;
   at a portion where the metal wire and the channel semiconductor layer intersect, the metal wire and the channel semiconductor layer are connected with each other through the variable resistance material layer;
   a side of the channel semiconductor layer closer to the substrate surface is connected with the first diffusion layer;
   the first diffusion layer is connected with a lower electrode; and
   the metal wire layer supplies an electric power to the first diffusion layer through the lower electrode.

3. The semiconductor memory device according to claim 2, wherein:
   the channel semiconductor layer is formed so that it surrounds the cell gate electrode from both of the first direction and the second direction; and
   a plurality of the metal wire is disposed in the first direction corresponding to the cell gate electrode, and each of the metal wire is electrically separated from each other in the first direction.

4. The semiconductor memory device according to claim 2, wherein:
   the channel semiconductor layer is formed only at both sides along the first direction around the cell gate electrode, and the channel semiconductor layers corresponding to each of the cell gate electrode are separated from each other in the second direction; and
   a plurality of the metal wire is disposed in the first direction corresponding to the cell gate electrode, and each of the metal wire is electrically separated from each other in the first direction.

5. The semiconductor memory device according to claim 2, wherein:
   the channel semiconductor layer is formed only at both sides along the first direction around the cell gate electrode, and the channel semiconductor layers corresponding to each of the cell gate electrode are connected with each other in the second direction; and
   a plurality of the metal wire is disposed in the first direction corresponding to the cell gate electrode, and each of the metal wire is electrically separated from each other in the first direction.

6. The semiconductor memory device according to claim 2, wherein:
   the channel semiconductor layer is formed so that it surrounds the cell gate electrode from both of the first direction and the second direction; and
   a plurality of the metal wire is disposed in the first direction corresponding to the cell gate electrode, and each of the metal wire is electrically connected with each other in the first direction.

7. The semiconductor memory device according to claim 1, wherein:
   a plurality of the cell gate electrode is disposed in parallel in a first direction parallel to a substrate surface and is extended in a second direction parallel to the substrate surface and perpendicular to the first direction, and multiple layers of the cell gate electrode are stacked, through insulating films, in a direction vertical to the substrate surface;
   the channel semiconductor layer is extended in the second direction along the cell gate electrode and is connected with the cell gate electrode through the gate insulating film;
   the metal wire is extended in a direction vertical to the substrate surface;
   the metal wire and the channel semiconductor layer are connected with each other through the variable resistance material layer;
   an edge portion of the channel semiconductor layer is connected with the first diffusion layer;
   the metal wire is connected with a lower electrode; and
   the metal wire layer supplies an electric power to the first diffusion layer through the lower electrode.

8. The semiconductor memory device according to claim 7, wherein:
   the metal wire is connected with the lower electrode through a first selection transistor extended in the first direction and a second selection transistor extended in the second direction; and
   each of the cell gate electrode is electrically connected with each other alternately in the first direction.

9. The semiconductor memory device according to claim 1, wherein:
   the variable resistance material layer is configured to form a memory cell storing information by a change in resistance value; and
   between a write operation writing information into the memory cell and a read operation reading information from the memory cell, the semiconductor memory device inverts:
       positive and negative polarities of an electric potential difference between the first diffusion layer and the metal wire connected with the selected memory cell;

positive and negative polarities of an electric potential difference between the first diffusion layer and the cell gate electrode connected with the selected memory cell;

or positive and negative polarities of an electric potential difference between the metal wire and the cell gate electrode connected with the selected memory cell.

10. The semiconductor memory device according to claim 9, wherein:
the semiconductor memory device generates, in the write operation, a Gate-Induced Drain Leakage at a junction boundary between the variable resistance material and the channel semiconductor layer.

11. The semiconductor memory device according to claim 9, wherein:
the semiconductor memory device applies, in the write operation, a reverse bias to a junction boundary between the variable resistance material and the channel semiconductor layer.

12. The semiconductor memory device according to claim 9, wherein:
a second diffusion layer having a conductive type different from that of the first diffusion layer is further connected with the channel semiconductor layer.

13. The semiconductor memory device according to claim 1, wherein:
a plurality of the cell gate electrode is disposed in parallel in a first direction parallel to a substrate surface;
the cell gate electrode is extended in a second direction parallel to the substrate surface and perpendicular to the first direction;
a plurality of holes is formed in each of the cell gate electrode;
the gate insulating film and the channel semiconductor layer are formed in the hole;
a side of the channel semiconductor layer closer to the substrate surface is connected with a lower electrode through the first diffusion layer;
a side of the channel semiconductor layer opposite to the lower electrode is electrically connected with the variable resistance material;
the variable resistance material is connected with the channel semiconductor layer and the metal wire; and
the metal wire layer supplies an electric power to the first diffusion layer through the lower electrode.

14. The semiconductor memory device according to claim 1, wherein:
the channel semiconductor layer is switchable between a conductive state and an insulated state.

15. The semiconductor memory device according to claim 1, wherein:
a conductive type of the channel semiconductor layer is determined by an electric potential of the cell gate electrode and an electric potential of the first diffusion layer.

16. A semiconductor memory device, comprising:
a stack in which a cell gate and an insulating film that are stacked alternately, a plurality of the cell gate and the insulating film being disposed in a first direction parallel to a substrate surface and being extended in a second direction parallel to the substrate surface and perpendicular to the first direction;
a gate insulating film formed at a side in the first direction of the stack;
a channel semiconductor layer connected with the cell gate through the gate insulating film, two of the channel semiconductor layers being opposed to each other in the first direction at a side in the first direction of the stack, and a plurality of the channel semiconductor layer being disposed in the second direction;
a variable resistance material layer electrically connecting the channel semiconductor layers opposing to each other in the first direction and electrically connecting the channel semiconductor layers opposing to each other in the second direction;
a bit line electrically connected with the channel semiconductor layer through a first diffusion layer at a side of the channel semiconductor layer farer from the substrate surface, the bit line being extended in the first direction, and a plurality of the bit lines being disposed in the second direction; and
a word line electrically connected with the channel semiconductor layer through a second diffusion layer at a side of the channel semiconductor layer closer to the substrate surface, the word line being extended in the first direction, and a plurality of the word lines being disposed in the second direction.

17. The semiconductor memory device according to claim 16, wherein:
the variable resistance material layer is configured to form a memory cell storing information by a change in resistance value; and
the semiconductor memory device reads information from the memory cell or writes information into the memory cell by allowing an electric current to flow through the variable resistance material layer between the channel semiconductor layers adjacent to each other in the second direction.

* * * * *